US012652964B2

(12) United States Patent
Tiwari et al.

(10) Patent No.: US 12,652,964 B2
(45) Date of Patent: Jun. 9, 2026

(54) A-AXIS JOSEPHSON JUNCTIONS WITH IMPROVED CONTACTS

(71) Applicant: Ambature, Inc., Scottsdale, AZ (US)

(72) Inventors: Archana Tiwari, Waterloo (CA);
Mitchell Robson, Toronto (CA);
Priyanka Brojabasi, Kitchener (CA)

(73) Assignee: Ambature, Inc., Scottsdale, AZ (US)

( * ) Notice: Subject to any disclaimer, the term of this
patent is extended or adjusted under 35
U.S.C. 154(b) by 366 days.

(21) Appl. No.: 18/442,149

(22) Filed: Feb. 15, 2024

(65) Prior Publication Data

US 2025/0040448 A1     Jan. 30, 2025

Related U.S. Application Data

(60) Provisional application No. 63/447,442, filed on Feb.
22, 2023, provisional application No. 63/446,086,
filed on Feb. 16, 2023.

(51) Int. Cl.
H10N 60/01      (2023.01)
H10N 60/12      (2023.01)
H10N 60/80      (2023.01)

(52) U.S. Cl.
CPC ......... H10N 60/0912 (2023.02); H10N 60/12
(2023.02); H10N 60/805 (2023.02)

(58) Field of Classification Search
CPC ... H10N 60/0912; H10N 60/12; H10N 60/805
See application file for complete search history.

(56) References Cited

U.S. PATENT DOCUMENTS

| | | | | |
|---|---|---|---|---|
| 5,155,658 A | * | 10/1992 | Inam | C04B 35/491 |
| | | | | 257/E21.01 |
| 5,240,904 A | * | 8/1993 | Tanaka | H10N 60/0632 |
| | | | | 427/126.3 |
| 5,455,451 A | * | 10/1995 | Usagawa | H10N 60/128 |
| | | | | 427/63 |
| 6,004,907 A | * | 12/1999 | Suh | H10N 60/0941 |
| | | | | 505/190 |
| 6,943,136 B2 | * | 9/2005 | Kwon | H10N 60/0632 |
| | | | | 505/238 |
| 12,369,501 B2 | * | 7/2025 | Ladizinsky | B82Y 10/00 |
| 2003/0071258 A1 | * | 4/2003 | Zagoskin | H10N 60/124 |
| | | | | 380/278 |

(Continued)

*Primary Examiner* — Eugene Lee
(74) *Attorney, Agent, or Firm* — Toering Patents PLLC

(57) ABSTRACT

In some implementations of the invention, a silicon dioxide (SiO$_2$) insulating layer added between islands of a top YBCO layer of a Josephson Junction isolates a contact layer from YBCO (or other conductive components) in the Josephson Junction. In some implementations of the invention, a SiO$_2$ insulating layer added between islands of a bottom YBCO layer of adjacent Josephson Junctions isolates the contact layer or other components from YBCO (or other conductive components) in the Josephson Junction. In some implementations of the invention, an etch stop layer may be deposited over the islands of the top YBCO layer prior to adding the SiO$_2$ insulating layer. This etch stop layer protects the top YBCO layer during the adding of the SiO$_2$ insulating layer and during subsequent formation of a via through the SiO$_2$ to the etch stop layer.

13 Claims, 25 Drawing Sheets

(56)          References Cited

U.S. PATENT DOCUMENTS

| | | | |
|---|---|---|---|
| 2003/0107033 A1* | 6/2003 | Tzalenchuk | H10N 60/124 |
| | | | 257/30 |
| 2004/0099861 A1* | 5/2004 | Shoji | H03B 15/00 |
| | | | 257/31 |
| 2020/0091398 A1* | 3/2020 | Lebby | H10N 60/124 |

* cited by examiner

CuO (111) on MgO (100)

Y₂O₃ (111) on ZrO₂:Y (111)

Vacuum a-axis YBCO a-axis PBCO a-axis YBCO cubic YBCO

LAO (100)

YBCO

PBCO

YBCO 5 nm

Overlay 2 nm

Fig. 23(g)

ROI 2 nm

FIGURE 23

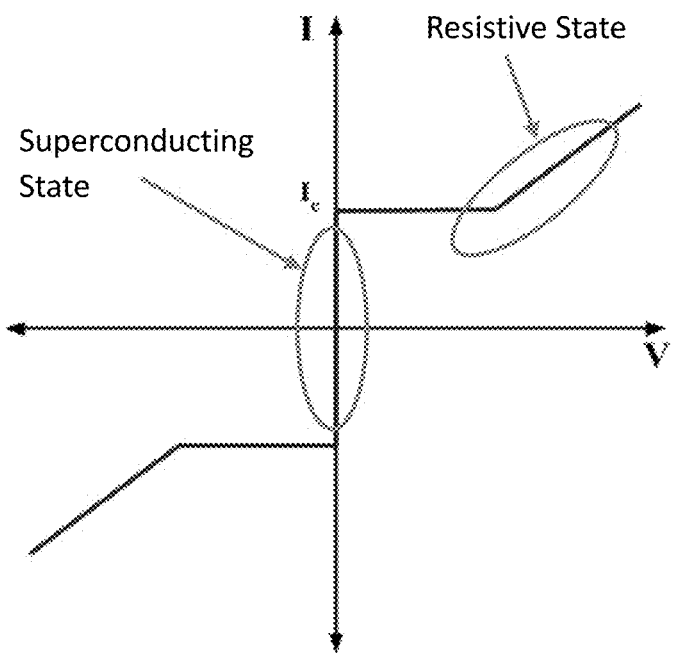
FIGURE 26
Initial Testing
Configuration
Final Testing
Configuration
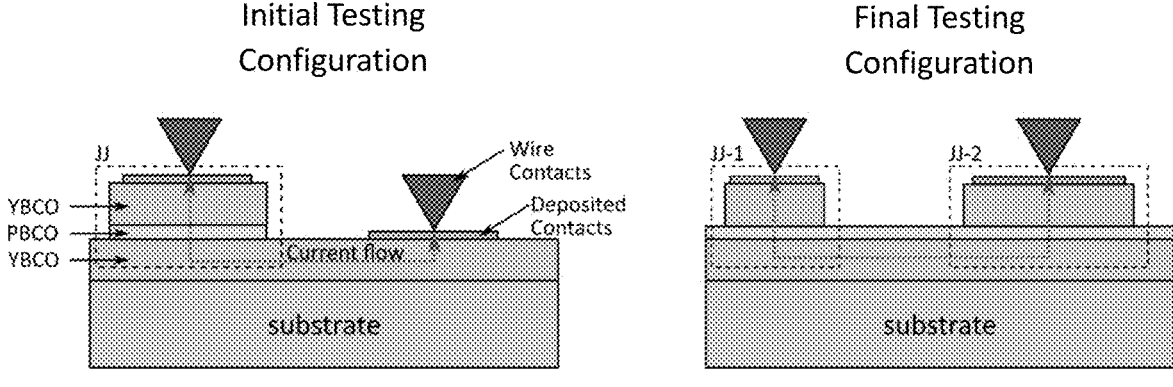
FIGURE 27(a)                    FIGURE 27(b)

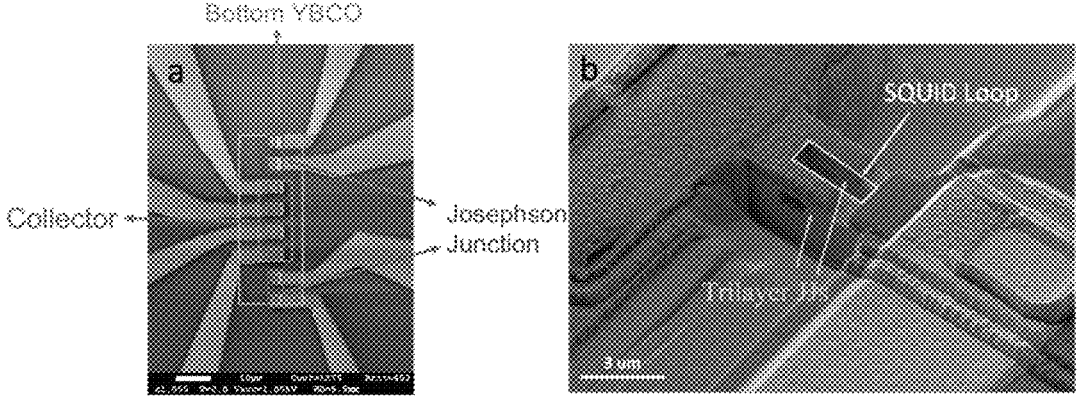
FIGURE 31(a)          FIGURE 31(b)
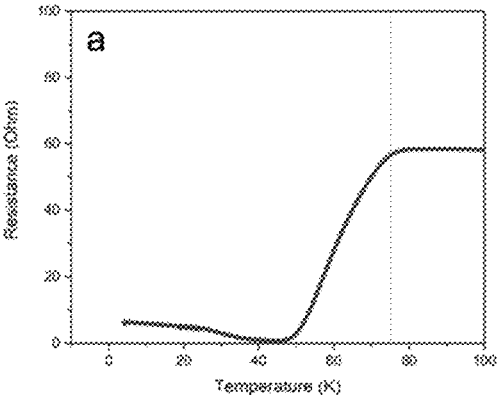
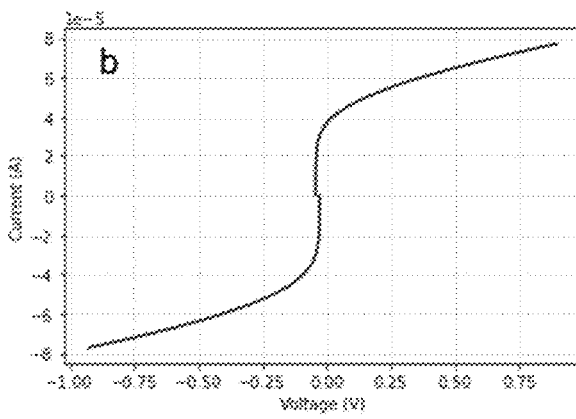
FIGURE 32(a)          FIGURE 32(b)

A-AXIS JOSEPHSON JUNCTIONS WITH IMPROVED CONTACTS

CROSS-REFERENCE TO RELATED APPLICATIONS

This application claims priority to U.S. Provisional Patent Application No. 63/447,442, entitled "A-axis Josephson Junctions with Improved Contacts," filed on Feb. 22, 2023; and this application claims priority to U.S. Provisional Patent Application No. 63/446,086, entitled "A-axis Josephson Junctions with Improved Contacts," filed on Feb. 16, 2023. Each of the foregoing applications is incorporated herein by reference in its entirety.

This application is related to U.S. patent application Ser. No. 17/859,419, entitled "A-axis Josephson Junctions with Improved Smoothness," filed on Jul. 7, 2022, which is incorporated herein by reference in its entirety.

FIELD OF THE INVENTION

The invention is generally related to Josephson Junctions, and more specifically, to techniques for manufacturing Josephson Junctions from a-axis YBCO with improved contacts.

BACKGROUND OF THE INVENTION

Recently, employing YBCO materials in an a-axis crystalline orientation have become desirable, including for fabricating Josephson Junctions. In order to simplify fabrication of a-axis Josephson Junctions (as well as other circuits employing a-axis materials), thick layers (e.g., greater than 100 nm) of a-axis materials and low surface roughness (e.g., less than 1 nm) are desired. However, researchers have found that conventional techniques for attaching electrical contacts to these Josephson Junctions have introduced undesired resistance and in some cases, inoperability of the Josephson Junctions themselves.

Improved contacts on Josephson Junctions formed from A-axis materials are needed.

SUMMARY OF THE INVENTION

According to various implementations of the invention, a silicon dioxide ($SiO_2$) insulating layer is added between islands of a top YBCO layer of a Josephson Junction to isolate a contact layer from YBCO (or other conductive components) in the Josephson Junction. In some implementations of the invention, a $SiO_2$ insulating layer added between islands of a bottom YBCO layer of adjacent Josephson Junctions isolates the contact layer or other components from YBCO (or other conductive components) in the Josephson Junction. In some implementations of the invention, an etch stop layer may be deposited over the islands of the top YBCO layer prior to adding the $SiO_2$ insulating layer. This etch stop layer protects the top YBCO layer during the adding of the $SiO_2$ insulating layer and during subsequent formation of a via through the $SiO_2$ to the etch stop layer.

According to some implementations of the invention, a method for fabricating a Josephson Junction includes: depositing a etch stop layer of gold on top of at least two spatially separated islands of YBCO, wherein the YBCO forms a top layer of an a-axis trilayer of YBCO/insulator/YBCO; depositing a layer of silicon dioxide between the at least two spatially separated islands of YBCO and over the etch stop layer; etching the silicon dioxide to expose the etch stop layer without exposing any other surfaces of the tri-layer; and depositing a contact layer directly onto the exposed etch stop layer. In some implementations of the invention, the insulator in the a-axis trilayer of YBCO/insulator/YBCO comprises PBCO. In some implementations of the invention, the etching of the silicon dioxide to expose the etch stop layer comprises forming a via in the silicon dioxide through to the etch stop layer.

According to some implementations of the invention, a method for fabricating a Josephson Junction includes: etching islands in a top YBCO layer of an a-axis trilayer of YBCO/PBCO/YBCO; depositing an etch stop layer of gold on top of the islands in the top YBCO layer; depositing a layer of silicon dioxide between the islands in the top YBCO layer and over the etch stop layer; etching the silicon dioxide to expose the etch stop layer without exposing any other surfaces of the trilayer; and depositing a contact layer directly onto the exposed etch stop layer, wherein the contact layer comprises a layer of gold.

These and other features of the invention are described in detail below.

BRIEF DESCRIPTION OF THE DRAWINGS

FIGS. 20(*a*)-20(*d*) generally illustrate cross-sectional high-resolution STEM images that reveal a microstructures of YBCO/PBCO/YBCO trilayers.

FIGS. 23(*a*)-23(*g*) generally illustrate a low-magnification cross-sectional high-resolution STEM images of a less-ideal YBCO/PBCO/YBCO trilayer.

FIG. 26 illustrates an ideal I-V curve for an operating Josephson Junction as would be appreciated.

FIGS. 27(*a*)-27(*b*) illustrate initial and final testing configurations for operation of the Josephson Junctions in accordance with various implementations of the invention.

FIGS. 31(*a*)-31(*b*) include SEM images of Josephon Junctions fabricated in accordance with various implementations of the invention.

FIGS. 32(*a*)-32(*b*) illustrate measured characteristics of Josephson Junction fabricated in accordance with various implementations of the invention.

DETAILED DESCRIPTION

Figure 1:
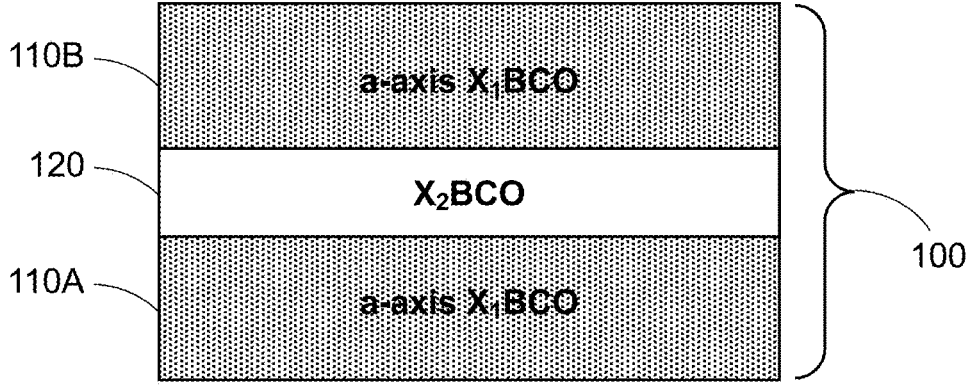
FIG. 1 illustrates Josephson Junction component layers having two conducting layers and an insulating layer between the conducting layers according to various implementations of the invention.

Various implementations of the invention utilize various perovskite materials including, but not limited to, $YBa_2Cu_3O_{7-x}$, $PrBa_2Cu_3O_{7-x}$, $DyBa_2Cu_3O_{7-x}$, $NdBa_2Cu_3O_{7-x}$, and other perovskites, which are commonly referred to as simply YBCO, PBCO, DBCO, NBCO, etc., respectively, as would be appreciated. Such materials may commonly and collectively be expressed as $XBa_2Cu_3O_{7-x}$ (XBCO) where X can be elements such as Y, Pr, Dy, Nd, etc., as would be appreciated.

According to various implementations of the invention, molecular beam epitaxy (MBE) may be used to grow very high quality XBCO thin films in an a-axis crystal orientation, though other processes for growing a-axis XBCO may be used as would be appreciated. Various implementations of the invention provide higher crystalline quality, higher accuracy in film thickness, higher a-axis orientation, as well as single crystal growth with lattice matching or strained lattice matching with XBCO-related thin film materials.

According to various implementations of the invention, high quality a-axis XBCO may be grown with low surface roughness. "Surface roughness" may be generally described as deviations in the direction of a normal vector of an actual surface(s) of the material from an ideal surface. One mechanism for achieving low surface roughness for a-axis XBCO is described in U.S. Provisional Patent Application No. 63/035,162, having a filing date of Jun. 5, 2020, and entitled "Forming A-axis YBCO by Molecular Beam Epitaxy," which is one of the priority applications incorporated above, and now described.

Various implementations of the invention are directed toward growing high quality a-axis XBCO on substrates. While various implementations of the invention are described as useful for growing high quality a-axis XBCO, such implementations may be used for growing high quality a-axis YBCO, or other perovskites, as would be appreciated.

For purposes of this description, "surface roughness" may be used to assess a quality of the a-axis XBCO, with lower measures of surface roughness being generally preferable to higher measures of roughness. Other measures may be used to assess a quality of a-axis XBCO as would be appreciated. In some implementations of the invention, surface roughness is less than 10 nm. In some implementations of the invention, surface roughness is less than 2 nm. In some implementations of the invention, surface roughness is less than 1.5 nm In some implementations of the invention, surface roughness is less than 0.5 nm.

According to various implementations of the invention, high quality a-axis XBCO may be obtained by: 1) adequately preparing a substrate; 2) calibrating MBE flux; and 3) controlling temperature during crystal growth. Each of these is described below.

According to various implementations of the invention, adequately preparing a substrate for subsequent XBCO crystal growth may be important for producing high quality a-axis XBCO. A "smooth" substrate (i.e., a substrate with low roughness) ensures a smoother XBCO surface. According to various implementations of the invention, reflection high-energy electron diffraction (RHEED) may be used to characterize the surface of the substrate. According to various implementations of the invention, a smooth substrate surface will produce clear RHEED patterns and ultimately, a smooth XBCO surface.

In some implementations of the invention, lanthanum aluminate ($LaAlO_3$ or commonly referred to as LAO) may be used a substrate. LAO is an inorganic, ceramic oxide with a distorted perovskite structure. Other similar materials may be used as the substrate as would be appreciated.

In some implementations of the invention, the substrate may have a uniformly terminated, atomically smooth surface. In some implementations of the invention, LAO may be terminated with aluminum oxide ($AlO_2$) for stability. In some implementations, LAO may be terminated with $AlO_2$ as described in J. R. Kim et al., "Experimental realization of atomically flat and $AlO_2$-terminated $LaAlO_3$ (001) substrate surfaces," Phys. Rev. Mater., vol. 3, no. 2, pp. 1-8, 2019 ("Kim"), which was included as Appendix A in U.S. Provisional Application No. 63/035,162, which is one of the priority applications incorporated above. Kim outlines a process for removing lanthanum and creating a smooth aluminum oxide surface.

In some implementations, the substrate may be etched in boiling water, annealed at 1300° C. in air for 10 hours, and then etched again in boiling water, to obtain an AlO2-terminated surface with a step-and-terrace morphology.

In some implementations of the invention, terminating the LAO to produce the $AlO_2$ surface may be accomplished by annealing the LAO substrate at 1200° C. under oxygen for nominally three hours and then sonicating the annealed LAO substrate in deionized water for nominally two hours.

In some implementations of the invention, LAO may be terminated with lanthanum oxide ($La_2O_3$) for stability as would be appreciated. In some implementations of the invention, LAO may be terminated with some mixture of aluminum oxide and lanthanum oxide as would be appreciated.

According to various implementations of the invention, calibrating atomic flux rates in the MBE may be may be important for producing high quality a-axis XBCO. For example when XBCO is YBCO, precise control of flux rates for each of yttrium, barium and copper atomic may be important for producing high quality a-axis YBCO. In such crystals, there are one yttrium and two barium atoms for every three copper atoms, so the incoming rate of atoms should be precisely set and controlled to these ratios (i.e., a rate of flux of yttrium is one third of a rate of flux of copper, and a rate of flux of barium is two thirds of the rate of flux of copper). Other ratios may be used when rare earth metals other than yttrium are used as would be appreciated.

In some implementations of the invention, stoiciometric flux calibration may be used as would be appreciated. In some implementations of the invention, RHEED or atomic absorption spectroscopy may be used to measure an incoming rate of the respective atoms.

In some implementations of the invention, a four-step calibration process may be used to calibrate atomic flux rates in the MBE. In a first step, fluxes of each of the constituent atoms are tuned near their target stoichiometric ratios using standard flux monitoring tools, such as a quartz crystal microbalance (QCM), a beam flux monitor (BFM), or other flux monitoring tools as would be appreciated. This first step may be referred to as a "coarse calibration."

In a second step, or "fine calibration," because each constituent atom of YBCO (yttrium, barium, copper) has an easy-to-form binary oxide (e.g., $Y_2O_3$, BaO and/or $BaO_2$, CuO and/or $Cu_2O$, etc.), such binary oxides may be grown sequentially on lattice-matched substrates or buffer layers (e.g., $Y_2O_3$ on YSZ, BaO or $BaO_2$ on STO, CuO or $Cu_2O$ on MgO) in conditions similar to those used to ultimately grow YBCO. During this fine calibration, in-situ RHEED and ex-situ X-ray reflectivity may provide very precise measurements of growth rate of these binary oxides which can be used to determine precise flux values using the standard lattice constants of the films and substrates as would be appreciated. Similar fine calibration using other binary oxides may be used when rare earth metals other than yttrium are used as would be appreciated.

In a third step, coarse calibration and fine calibration are repeated until the target flux ratios are obtained. In some implementations of the invention, the flux rate for one of constituent atoms may be set, and then the flux rate(s) of the remaining constituent atom(s) may be iteratively tuned to their corresponding flux ratio. In some implementations of the invention, a flux rate of copper may be set, and then flux rates of yttrium and barium may be iteratively tuned to one third and two thirds of copper, respectively.

In a fourth step, a calibration test sample of XBCO may be completed on a small scale, such as a 1 cm×1 cm substrate. In some implementations, the calibration test sample may be analyzed via ex-situ x-ray diffraction (XRD), which may provide information regarding the composition and quality of the calibration test sample as measured, for example, by standard tools such as atomic force microscope (AFM), transmission electron microscopy (TEM), scanning electron microscope (SEM), etc. In some implementations, the calibration test sample may be analyzed via in-situ x-ray photoelectron spectroscopy (XPS), which may provide information regarding the composition and quality of the calibration test sample. Other techniques that will provide compositional information may be Rutherford backscatter spectrometery (RBS), electron energy loss spectroscopy (EELS), electron dispersive x-ray spectroscopy (EDX), etc. Based on the composition of the calibration test sample, any of the foregoing steps may be repeated to further fine tune the flux rates.

According to various implementations of the invention, controlling temperature during crystal growth during MBE may be may be important for producing high quality a-axis XBCO. In some implementations of the invention, a positive temperate ramp may be desirable during crystal growth. In some implementations of the invention, starting crystal growth at a low temperature may force XBCO crystals to form in the a-axis orientation. In some implementations of the invention, slowly increasing temperature maintains the a-axis orientation of the XBCO crystals while improving crystal quality and material properties, including, but not limited to, superconducting properties.

Figure 8:
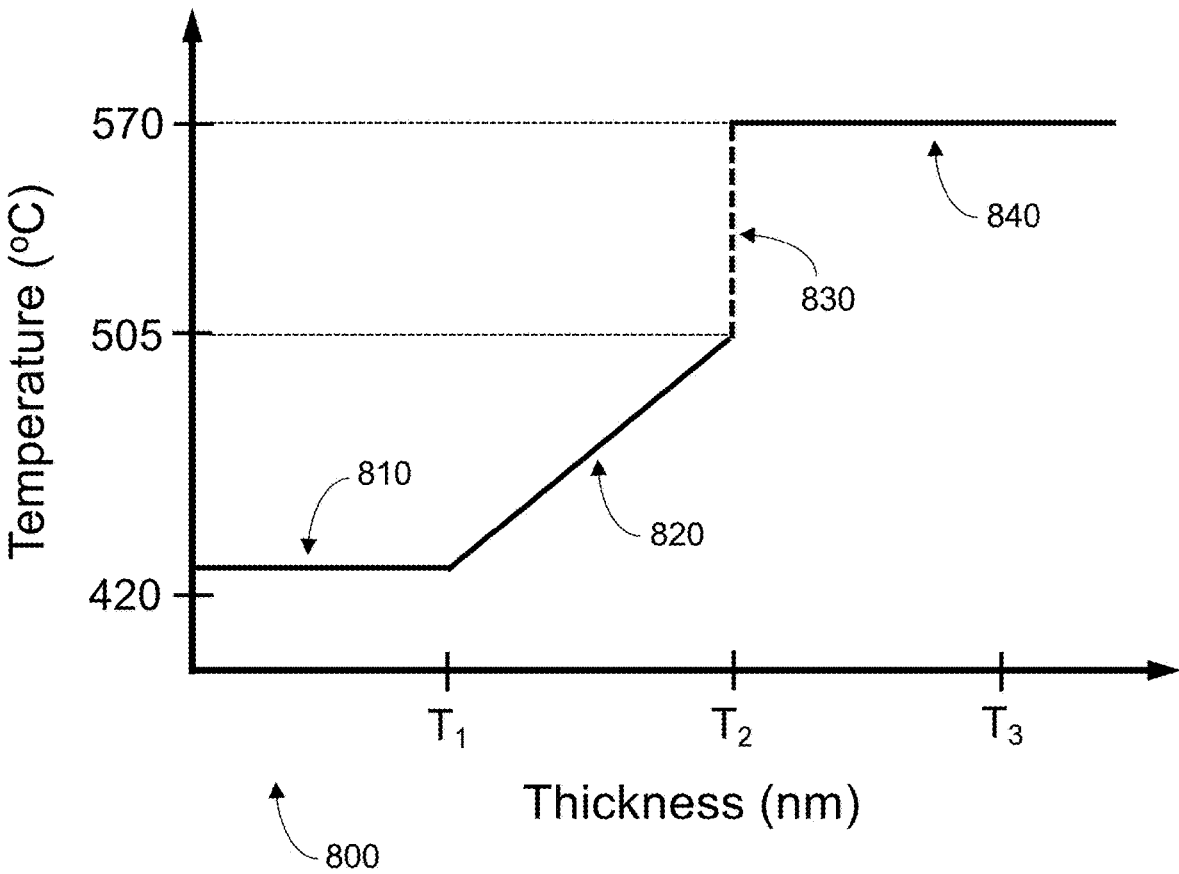
FIG. 8 illustrates a growth temperature profile according to various implementations of the invention.

FIG. 8 illustrates a growth temperature profile 800 according to various implementations of the invention. Growth temperature profile 800 plots a chamber temperature against a thickness of XBCO. During a first profile portion 810 of profile 800, optimized a-axis XBCO may be grown as a thin template layer at an initial temperature. In some implementations of the invention, this initial temperature may be in the range 400-500° C.; in some implementations of the invention, this initial temperature may be in the range 400-440° C.; in some implementations of the invention, this initial temperature may be in the range 410-430° C.; in some implementations of the invention, this initial temperature may be nominally 420° C.; other initial temperatures or temperature ranges may be used as would be appreciated. In some implementations of the invention, this thin template layer may be less than 20 nm in thickness; in some implementations of the invention, this thin template layer may be 10-20 nm in thickness; in some implementations of the invention, this thin template layer may be 1-10 nm in thickness; in some implementations of the invention, this thin template layer may be 1-5 nm in thickness; other thicknesses may be used as would be appreciated.

During a second profile portion 820, the chamber temperature may be ramped to an intermediate temperature without otherwise changing or disrupting crystal growth. In some implementations of the invention, the chamber temperature may be ramped to the intermediate temperature at a temperature ramp rate. In some implementations of the invention, the intermediate temperature may be 505° C., though other intermediate temperatures may be used as would be appreciated. In some implementations of the invention, the temperature ramp rate may be 10° C./nm, although the temperature ramp rate may range from 0.5° C./nm to 30° C./nm; other temperature ramp rates may be used, including varying temperature ramp rates, different temperature ramp rates, etc., as would be appreciated. In some implementations of the invention, the temperature ramp rate may be linear; in some implementations of the invention, the temperature ramp rate may be sublinear; or in some implementations of the invention, the temperature ramp rate may be superlinear. In some implementations of the invention, the temperature ramp may be non-linear. In some implementations of the invention, the temperature ramp may vary in stepwise fashion. In some implementations of the invention, the temperature may be a combination of any of the above.

During a third profile portion 830, beginning when the chamber temperature reaches the intermediate temperature and ending when the chamber temperature reaches a final growth temperature, the fluxes of the constituent atoms of XBCO (i.e., X, B, C) are turned off with only oxygen remaining on. In some implementations of the invention, the chamber temperature may be adjusted to the final growth temperature. In some implementations of the invention, the chamber temperature may be ramped to the final growth temperature at a second temperature ramp rate. In some implementations of the invention, the second temperature ramp rate may be the same or nominally similar to the temperature ramp rate during second profile portion 820; though other second temperature ramp rates may be used as would be appreciated. In some implementations of the invention, the final growth temperature may be 570° C., though other final growth temperatures or ranges of final growth temperatures may be used as would be appreciated.

During a fourth profile portion 840, beginning when the chamber temperature reaches the final growth temperature, the fluxes of the constituent atoms of XBCO (i.e., X, B, C) are turned backed on. In some implementations of the invention, the chamber temperature remains constant at the final growth temperature until a desired thickness of XBCO is obtained as would be appreciated.

In some implementations of the invention, once the desired thickness of XBCO is obtained, a layer of $X_2BCO$ may be grown on top of the XBCO, where $X_2$ may be different from X. For example, a layer of PBCO may be grown on top of a layer of YBCO. In this example, PBCO may be grown on top of YBCO by exchanging the flux of yttrium with a flux of praseodymium. Further alternating layers or differing layers may be grown as would be appreciated.

Table 1 compares a-axis YBCO grown in accordance with various implementations of the invention with a-axis YBCO grown as described in the following papers: 1) Takeuchi et al., "Fabrication of in-plane aligned a-axis oriented YBa2Cu3O7-x trilayer Josephson junctions," *Appl. Phys. Lett.*, vol. 69, no. 1, pp. 112-114, 1996; 2) Trajanovic, et al., "Oxygen pressure dependence of the grain size and surface morphology in YBa 2 Cu 3 O 7-x a-axis films," *Appl. Phys. Lett.*, vol. 66, no. 12, pp. 1536-1538, March 1995; 3) Takeuchi et al., "Fabrication of all in-plane oriented a-axis YBa 2 Cu 3 O 7-x/insulator/YBa 2 Cu 3 O 7-x heterostructures," *Appl. Phys. Lett.*, vol. 66, no. 14, pp. 1824-1826, April 1995; and 4) Trajanovic, et al., "Growth Optimization and Characterization of a-axis Oriented Y—Ba—Cu—O Thin Films on (100) LaSrGa04 Substrates," *IEEE Trans. Appl. Supercond.*, vol. 5, no. 2, pp. 1237-1240, 1995. Each of these papers was included in Appendix B of U.S. Provisional Application No. 63/035,162, which is one of the priority applications incorporated above. For purposes of clarity, these papers describe growing samples of YBCO in PLD on SLGO substrates.

TABLE 1

| Comparision of Results | | |
|---|---|---|
| Measurement | YBCO - Takeuchi [1]-[4] | YBCO - Aspects of Invention |
| Roughness | 5 nm @ 380 nm thickness | 0.63 nm @ 40 nm thickness |
| Transition Temperature | 85K @ 50 nm | 89K @ 50 nm |
| % a-axis by XRD | >95% (beyond instrument precision) | >95% (in some cases >99%) |

FIG. 1 illustrates Josephson Junction (JJ) component layers 100 useful for describing various implementations of the invention. In various implementations of the invention, JJ component layers 100 may include two conducting layers 110 of a-axis $X_1BCO$ (Illustrated in FIG. 1 as a conducting layer 110A and a conducting layer 110B) and an insulating layer 120 of $X_2BCO$ between conducting layers 110. In some implementations, $X_2BCO$ may be oriented along an a-axis (i.e., a-axis $X_2BCO$) or oriented along another axis as would be appreciated. In some implementations, $X_1$ and $X_2$ are different elements (and hence, $X_1BCO$ and $X_2BCO$ are different materials) as would be appreciated. In some implementations, $X_1$ and $X_2$ are the same element, though $X_1BCO$ and $X_2BCO$ are arranged in different orientations (e.g., one a-axis and one c-axis, etc.). In some implementations, $X_1$ and $X_2$ are the same element, though $X_1BCO$ and $X_2BCO$ are arranged in the same general orientation, but with different angular offsets (e.g., one a-axis with 0° offset and one a-axis with 30° offset, etc.). In some implementations, each conducting layer 110 comprises a-axis YBCO and insulating layer 120 comprises PBCO, though other conducting layers and/or insulating layers may be used as would be appreciated. In some implementations, each conducting layer 110 comprises a-axis YBCO and insulating layer 120 comprises a-axis PBCO, though other conducting layers, insulating layers, and/or orientations may be used as would be appreciated.

As discussed above, thick conducting layers 110 are desired to facilitate fabrication of JJ components 100 with other semiconductor components using conventional semiconductor processes. For example, in some implementations, conducting layer 110A may have a desired thickness of 100 nm, or more. However, increasing the thickness of layers of a-axis XBCO (e.g., YBCO) often results in increasing surface roughness. For example, surface roughness of a-axis YBCO exceeds 2 nm for thicknesses of 100 nm, or more. Such surface roughness may not be conducive for fabricating JJ components 100 with other stacked semiconductor components.

Various implementations of the invention, in order to achieve, in effect, thicker layers of conducting layer 110A, employ an initial smoothing layer of c-axis XBCO beneath conducting layer 110A. C-axis XBCO does not suffer from increases in surface roughness as thickness increases to the degree that a-axis XBCO does. Thus, thicker layers of c-axis XBCO may be used to achieve a given surface roughness as compared with layers of a-axis XBCO.

Figure 2:
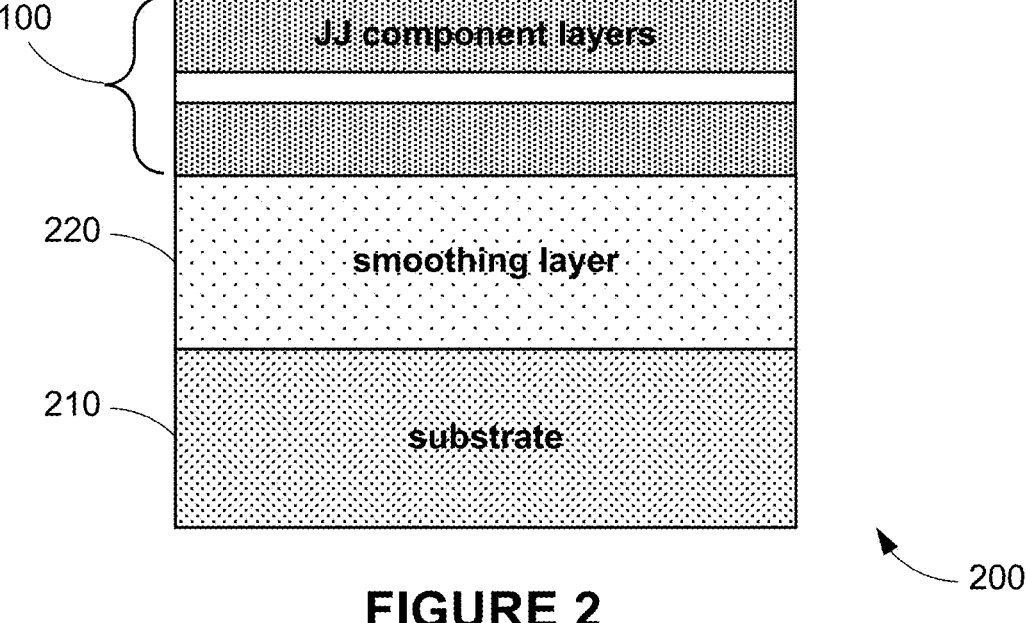
FIG. 2 illustrates a wafer of Josephson Junction component layers on top of a smoothing layer according to various implementations of the invention.

FIG. 2 illustrates a wafer 200 including JJ component layers 100 layered on top of a smoothing layer 220 and a substrate 210 according to various implementations of the invention. According to the invention, smoothing layer 220 may be used to increase an effective thickness of conducting layer 110A (i.e., a combined thickness of smoothing layer 220 and conducting layer 110A) without increasing surface roughness of conducting layer 110A. In some implementations of the invention, smoothing layer 220 comprises c-axis $X_1BCO$. In some implementations of the invention smoothing layer 220 comprises c-axis $X_nBCO$, where $X_1$ and $X_n$ are different elements (and hence $X_1BCO$ and $X_nBCO$ are different materials). In general, smoothing layer 220 may have a thickness of 1 nm to 1 μm, or more.

In some implementations of the invention, smoothing layer 220 may patterned, for example, via post-epitaxial etching, as a wiring layer as an added benefit. In implementations, where smoothing layer 220 comprises c-axis XBCO, superconducting currents may optimally flow in both horizontal directions, whereas in a-axis XBCO, superconducting currents optimally flow in only one horizontal direction along with a vertical direction as would be appreciated.

Figure 3:
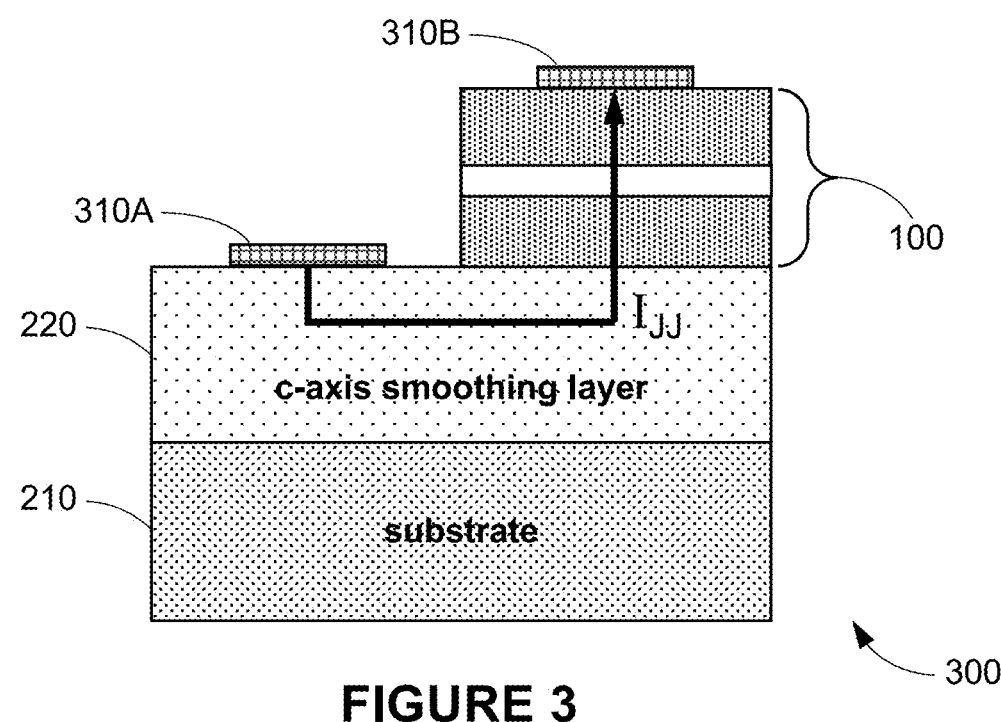
FIG. 3 illustrates an a-axis Josephson Junction according to various implementations of the invention.

FIG. 3 illustrates an a-axis Josephson Junction 300 according to various implementations of the invention. As illustrated, wafer 200 is etched (and more specifically, JJ component layers 100 of wafer 200 are etched) to partially reveal smoothing layer 220. Further processing lays down a terminal pad 310A on smoothing layer 220 and a terminal pad 310B on conducting layer 110B to provide electrical connections for a-axis Josephson Junction 300. According to various implementations of the invention, when in use, current applied to terminal pad 310A flows through smoothing layer 220 to conducting layer 110A, through conducting layer 110A, across insulating layer 120, and through conducting layer 110B to terminal pad 310B.

Figure 4:
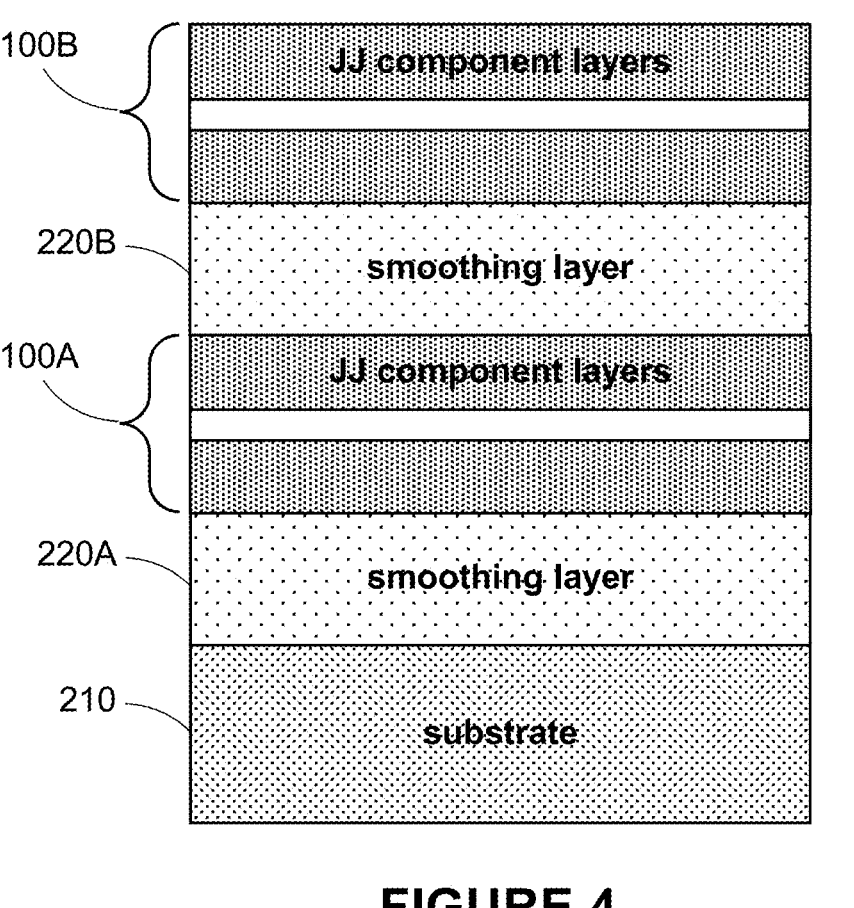
FIG. 4 illustrates a smoothing layer in between stacked Josephson Junction component layers according to various implementations of the invention.

FIG. 4 illustrates a stack 400 of JJ component layers 100 (illustrated as JJ component layers 100A and JJ component layers 100B) with an additional smoothing layer 220B disposed in between them according to various implementations of the invention. According to various implementations of the invention, any surface roughness found on top of first JJ component layers 100A may be reduced using smoothing layer 220B in preparation for second JJ component layers 100B. In this way, surface roughness introduced by each JJ component layers 100 are not cumulative through a given stack and may be mitigated by introducing intermediate smoothing layers 220 as would be appreciated.

Figure 5:
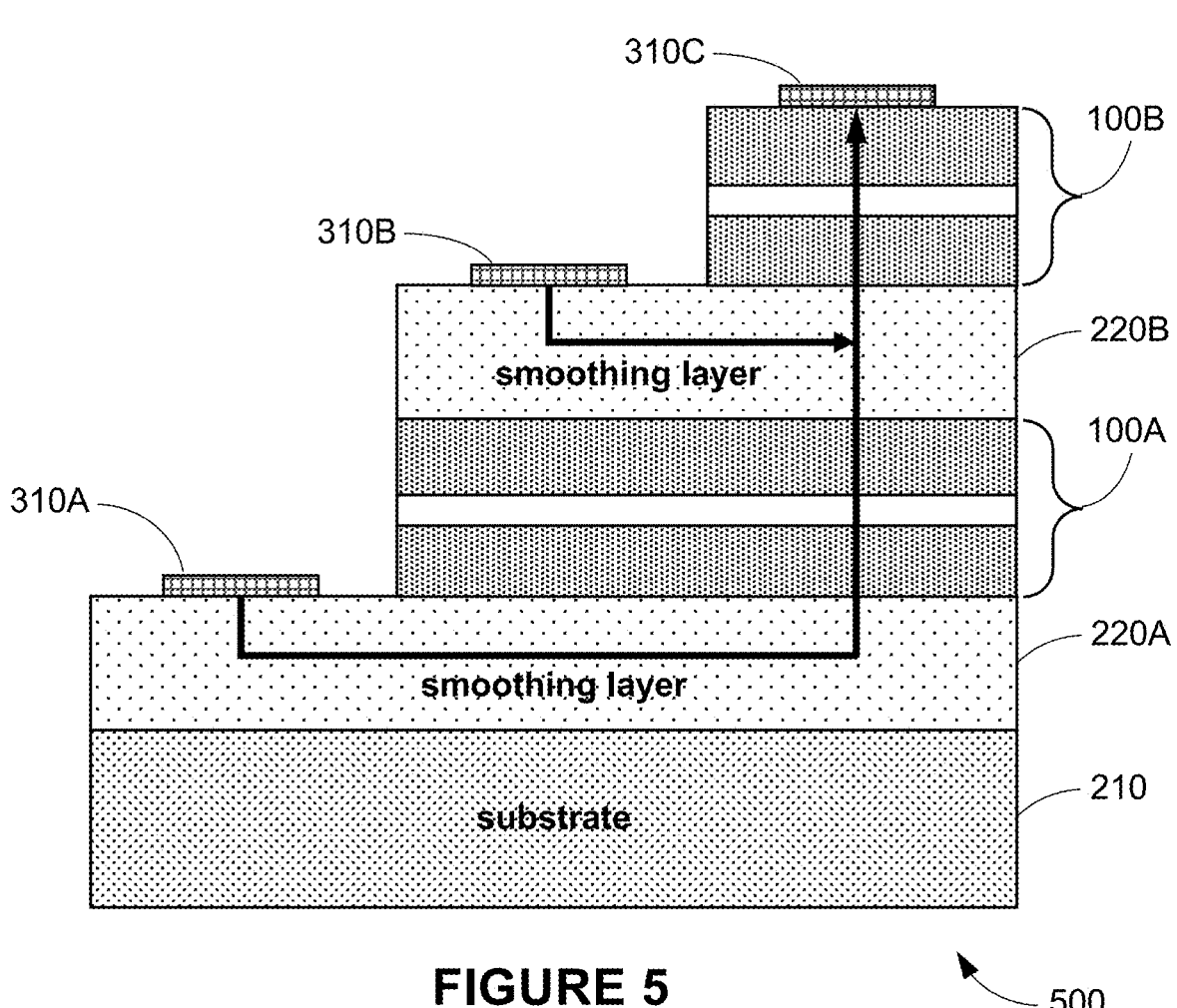
FIG. 5 illustrates multiple a-axis Josephson Junctions according to various implementations of the invention.

FIG. 5 illustrates an example stacked device 500 of a-axis Josephson Junctions according to various implementations of the invention. As illustrated, stack 400 is etched to partially reveal smoothing layer 220A and smoothing layer 220B. Further processing lays down a terminal pad 310A on smoothing layer 220A, a terminal pad 310B on smoothing layer 220B, and a terminal pad 310C on top of JJ component layers 100B to provide electrical connections for two a-axis Josephson Junctions. Other configurations and numbers of Josephson Junctions may be used as would be appreciated.

Figure 6:
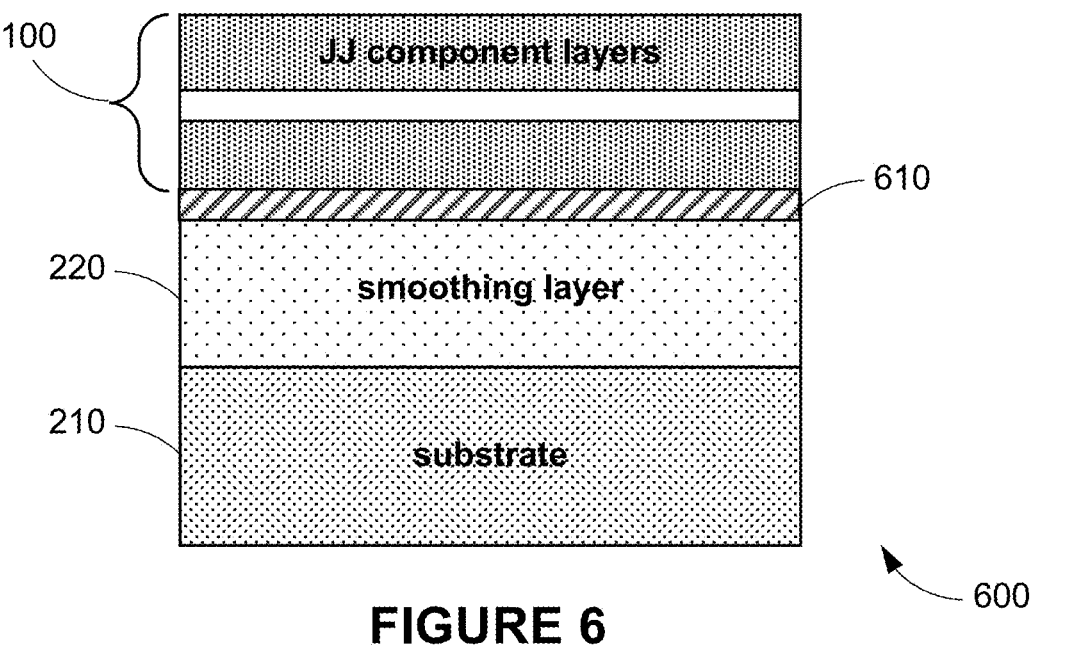
FIG. 6 illustrates a wafer of Josephson Junction component layers on top of a smoothing layer, with a transition layer disposed in between, according to various implementations of the invention.

FIG. 6 illustrates a wafer 600 of JJ component layers 100 on top of a smoothing layer 220, with a transition layer 610 disposed in between JJ component layers 100 and smoothing layer 220, according to various implementations of the invention. In some implementations of the invention, transition layer 610 comprises a mix of materials, or mix of material orientations, as the respective layers transission between smoothing layer 220 (e.g., a layer of c-axis XBCO)

and conducting layer 110A (e.g., a layer of a-axis XBCO). In some implementations of the invention, transistion layer 610 may have a thickness of approximately 1 nm; though in other implementations, transistion layer 610 may have a thickness of 20 nm or more, depending on quality of growth of the materials as would be appreciated. In some implementations, transition layer 610 may provide passive electrical functions, such as impedance and/or capacitance as would be appreciated.

Figure 7:
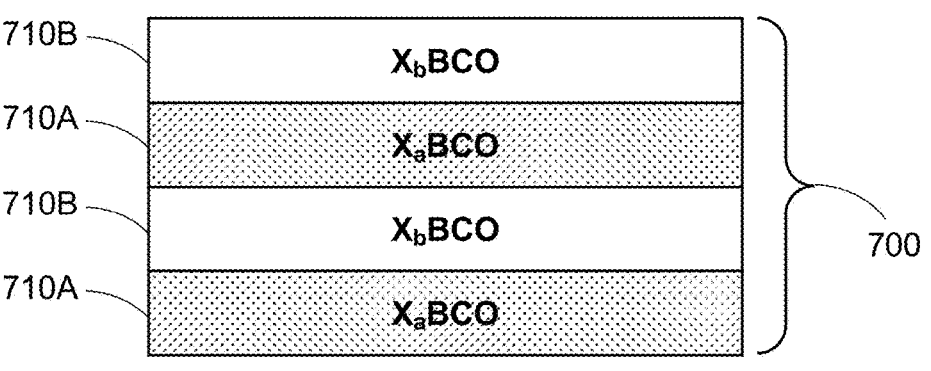
FIG. 7 illustrates a superlattice according to various implementations of the invention.

In some implementations of the invention, a superlattice 700 comprised of different layers 710 of materials may be constructed as illustrated in FIG. 7. In some implementations, superlattice 700 may be used in place of any layer or combination of layers referenced above. In some implementations of the invention, superlattice 700 may comprise any number of layers 710A formed in a pattern alternating between layer 710A and layer 710B. While illustrated as having alternating layers 710 of two different materials, such configuration of superlattice 700 is not necessary, and any number of different and/or alternating layers 710 or patterns of layers 710 may be used as would be appreciated. In some implementations of the invention, superlattice 700 may comprise any number of the same or different insulating layers 710. In some implementations of the invention, superlattice 700 may comprise any number of the same or different conducting layers 710. In some implementations of the invention, superlattice 700 may comprise any number of insulating and/or conducting layers 710 as would be appreciated. In some implementations, layers 710 may have a thickness of 1 nm to 50 nm or more, as would be appreciated.

In some implementations, layer 710A may be comprised of $X_aBCO$ and layer 710B may be comprised of $X_bBCO$. In some implementations, any number of different layers 710 may be used, each comprised of a different $X_iBCO$, repeating in pattern or otherwise. In some implementations, $X_aBCO$ is a different material than $X_bBCO$ (and/or $X_iBCO$, etc., as the case may be); for example, where $X_a$ is a different element that $X_b$(and/or $X_i$, etc.). In some implementations, $X_aBCO$ and $X_bBCO$ (and/or $X_iBCO$, etc., as the case may be) may be the same material in a different orientation from one another; for example, where $X_aBCO$ is a material oriented in the a-axis and $X_bBCO$ is the same material oriented in the b-axis, or where $X_aBCO$ is a material oriented in the b-axis and $X_bBCO$ is the same material oriented in the c-axis, or where $X_aBCO$ is a material oriented in the a-axis and $X_bBCO$ is the same material oriented in the c-axis. In some implementations, $X_aBCO$ and $X_bBCO$ (and/or $X_iBCO$, etc., as the case may be) may be the same material in a similar orientation with one another, but with a different offset; for example, where $X_aBCO$ is a material oriented along the a-axis with a 0° offset and $X_bBCO$ is the same material oriented along the a-axis with a 30° offset, or other offset as would be appreciated. In some implementations, $X_aBCO$ and $X_bBCO$ (and/or $X_iBCO$, etc., as the case may be) may be the same material with a different stoichiometry from one another. In some implementations, any combination of the foregoing differences between $X_aBCO$ and $X_bBCO$ may be used to form superlattice 700; for example, layer 710A may comprise a-axis $X_aBCO$ and layer 710B may comprise c-axis $X_bBCO$, where in addition to different orientations, elements $X_a$ and $X_b$ are also different elements. Other combinations of layers may be used as would be appreciated.

Example 1

To achieve the desired Y(Pr):Ba:Cu=1:2:3 composition ratio in the deposited $Y(Pr)Ba_2Cu_3O_{7-x}$ films, these elements are assumed to have a sticking coefficient of unity for the growth conditions used for $Y(Pr)Ba_2Cu_3O_{7-x}$. Under this assumption, the individual fluxes of yttrium, praseodymium, barium, and copper are established by synthesizing epitaxial films of their respective binary oxides individually, and either x-ray reflectivity (XRR) or RHEED oscillations are used to determine the thicknesses of these calibration films. From the measured film thickness and assuming (1) unity sticking coefficients of these cations for the growth conditions used to grow the binary oxide calibration films and (2) that these calibration films are fully relaxed and have the bulk density of these binary oxides, the respective elemental fluxes are calculated. Having established the elemental fluxes under the assumptions stated, the temperatures of the MBE effusion cells containing yttrium, praseodymium, barium, and copper are adjusted until the binary oxide calibration films grown with these sources indicate that the desired 1:2:3 flux ratio among Y(Pr):Ba:Cu. At this point, the growths of $Y(Pr)Ba_2Cu_3O_{7-x}$ and $YBa_2Cu_3O_{7-x}/PrBa_2Cu_3O_{7-x}/YBa_2Cu_3O_{7-x}$ trilayers commence. These binary oxide flux calibrations may be performed each day, immediately prior to the growth of $Y(Pr)Ba_2Cu_3O_{7-x}$ and $YBa_2Cu_3O_{7-x}/PrBa_2Cu_3O_{7-x}/YBa_2Cu_3O_{7-x}$ trilayers to achieve the growth of stoichiometric films. The demonstrated success in growing phase-pure $Y(Pr)Ba_2Cu_3O_{7-x}$ thin films and $YBa_2Cu_3O_{7-x}/PrBa_2Cu_3O_{7-x}/YBa_2Cu_3O_{7-x}$ trilayers attests to the validity of the assumptions made in this calibration procedure.

The conditions used to grow each of the binary oxides—$Y_2O_3$, $PrO_2$, BaO, and CuO—are outlined in Table 2. Also shown are the substrates used and epitaxial orientations of the resulting binary oxide calibration films. In all cases, the oxidant used is distilled ozone (~80% $O_3$+20% $O_2$), i.e., the same oxidant and background pressure used for the growth of the subsequent $Y(Pr)Ba_2Cu_3O_{7-x}$ thin films and $YBa_2Cu_3O_{7-x}/PrBa_2Cu_3O_{7-x}/YBa_2Cu_3O_{7-x}$ trilayers. For $Y_2O_3$, $PrO_2$, and CuO the thickness of the calibration film is measured by XRR. For hydroscopic BaO, the RHEED oscillation periodicity corresponding to the smallest charge-neutral formula unit of BaO, which in the case of BaO is half of the cubic lattice constant of BaO, is used to calculate the barium flux. Examples of the RHEED patterns, RHEED oscillations, XRD $\theta$-2$\theta$ scans, and XRR scans for this calibration method are illustrated for each binary oxide in FIGS. 14-17. The orientation relationships of the binary oxide calibration layers are: (111) $Y_2O_3\|$(111) YSZ and [$\bar{1}$10] $Y_2O_3\|[\bar{1}10]$ YSZ, (111) $PrO_2\|$(111) YSZ and [$\bar{1}$10] $PrO_2\|[\bar{1}10]$ YSZ, (100) BaO$\|$(100) $SrTiO_3$ and [100] BaO$\|$[110] $SrTiO_3$, and (111) CuO$\|$(100) MgO and [$\bar{1}$10] CuO$\|$[110] MgO. (YSZ=$(ZrO_2)_{0.905}(Y_2O_3)_{0.095}$ (or 9.5 mol % yttria-stabilized zirconia.))

TABLE 2

| Binary Growth Conditions | | | |
| --- | --- | --- | --- |
| Binary oxide | Substrate | Temperature (° C.) | Pressure (Torr) |
| (111) CuO | (100) MgO | Room Temperature | $1 \times 10^{-6}$ |
| (100) BaO | (100) $SrTiO_3$ | 600 | $1 \times 10^{-6}$ |
| (111) $Y_2O_3$ | (111) YSZ | 900 | $1 \times 10^{-6}$ |
| (111) $PrO_2$ | (111) YSZ | 900 | $1 \times 10^{-6}$ |

Figures 14A, 14B, 14C, 14D:
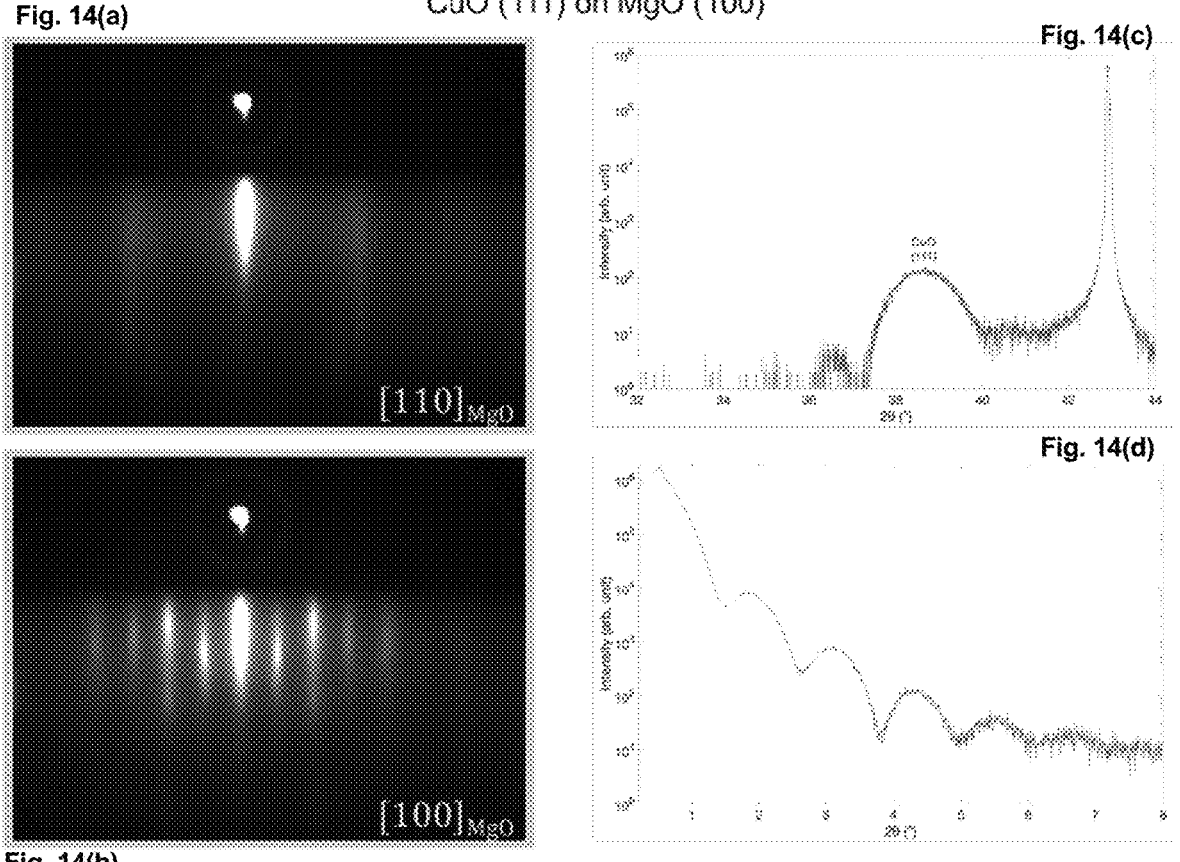
FIGS. 14(*a*)-14(*d*) generally illustrate growth of a CuO calibration film.

FIGS. 14(a)-14(d) generally illustrate growth of a CuO calibration film. FIGS. 14(a) and 14(b) illustrate RHEED patterns along the [110] and [100] azimuths of MgO. FIG. 14(c) illustrates $\theta$-2$\theta$ XRD scan and FIG. 14(d) illustrates x-ray reflectivity scan. The example illustrated corresponds to a 12.2 nm thick CuO calibration film.

Figures 15A, 15B, 15C:
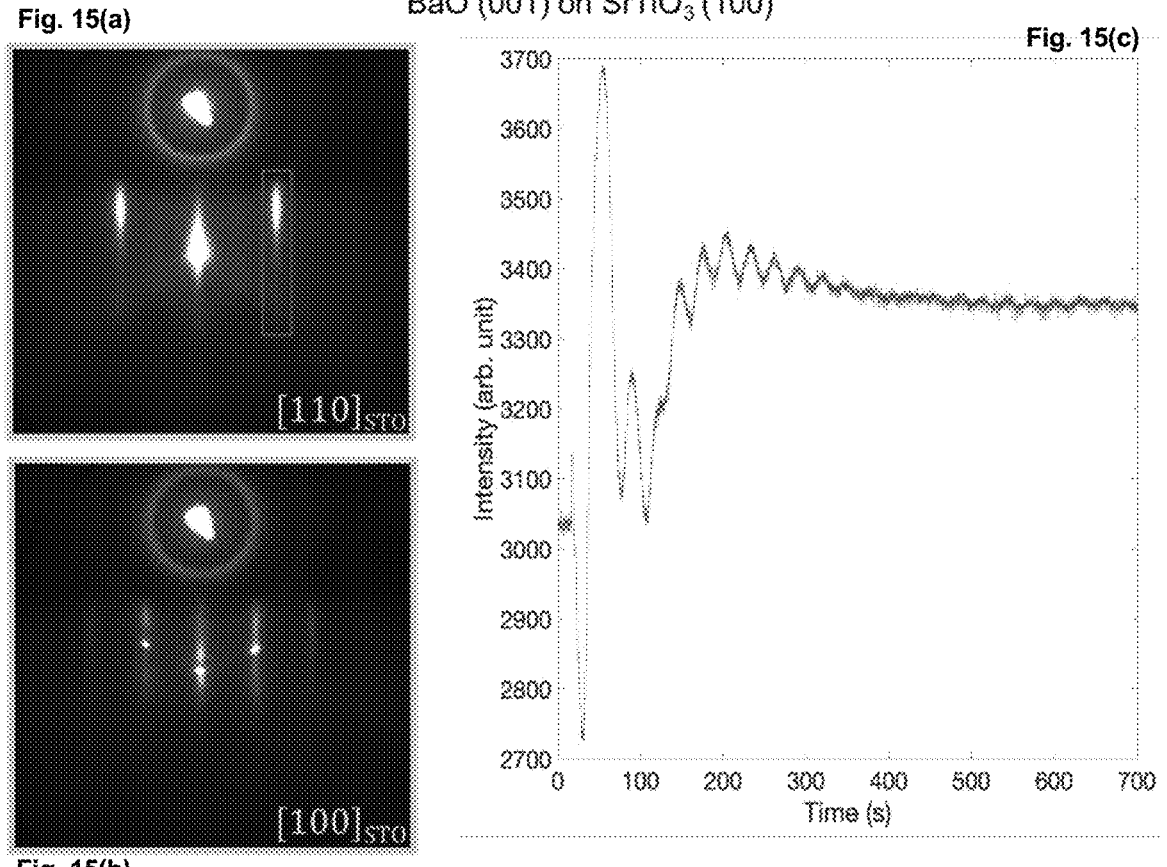
FIGS. 15(*a*)-15(*c*) generally illustrate growth of a BaO calibration film.

FIGS. 15(a)-15(c) generally illustrate growth of a BaO calibration film. FIGS. 15(a) and 15(b) illustrate RHEED patterns along the [110] and [100] azimuths of $SrTiO_3$. FIG. 15(c) illustrates RHEED oscillations of the diffracted streak from the outline red box showing layer-by-layer growth. The example illustrated corresponds to a ~7 nm thick BaO calibration film.

Figures 16A, 16B, 16C, 16D:
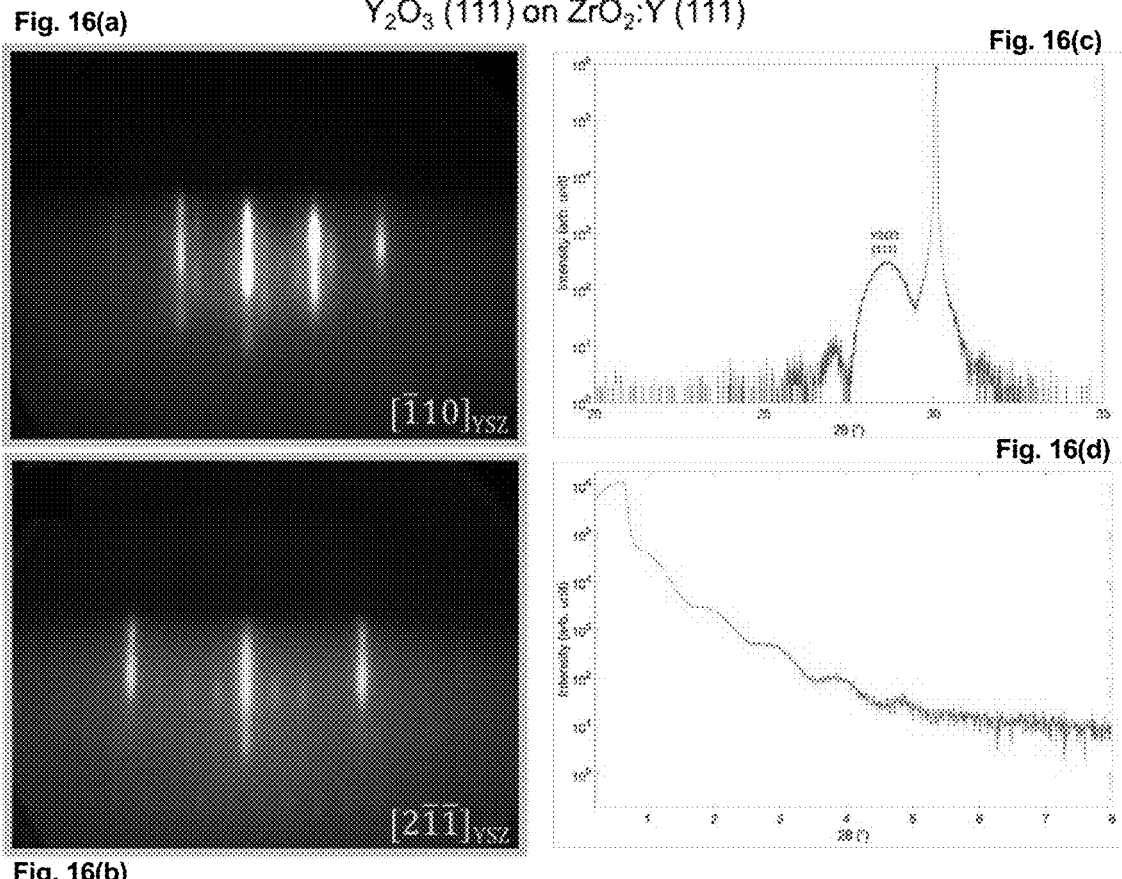
FIGS. 16(*a*)-16(*d*) generally illustrate growth of a $Y_2O_3$ calibration film.

FIGS. 16(a)-16(c) generally illustrate growth of a $Y_2O_3$ calibration film. FIG. 16(a) and FIG. 16(b) illustrate RHEED patterns along the [110] and [211] azimuths of YSZ. FIG. 16(c) illustrates a $\theta$-2$\theta$ scan and FIG. 16(d) illustrates a x-ray reflectivity scan. The example illustrated corresponds to a 11.5 nm thick $Y_2O_3$ calibration film.

Figures 17A, 17B, 17C, 17D:
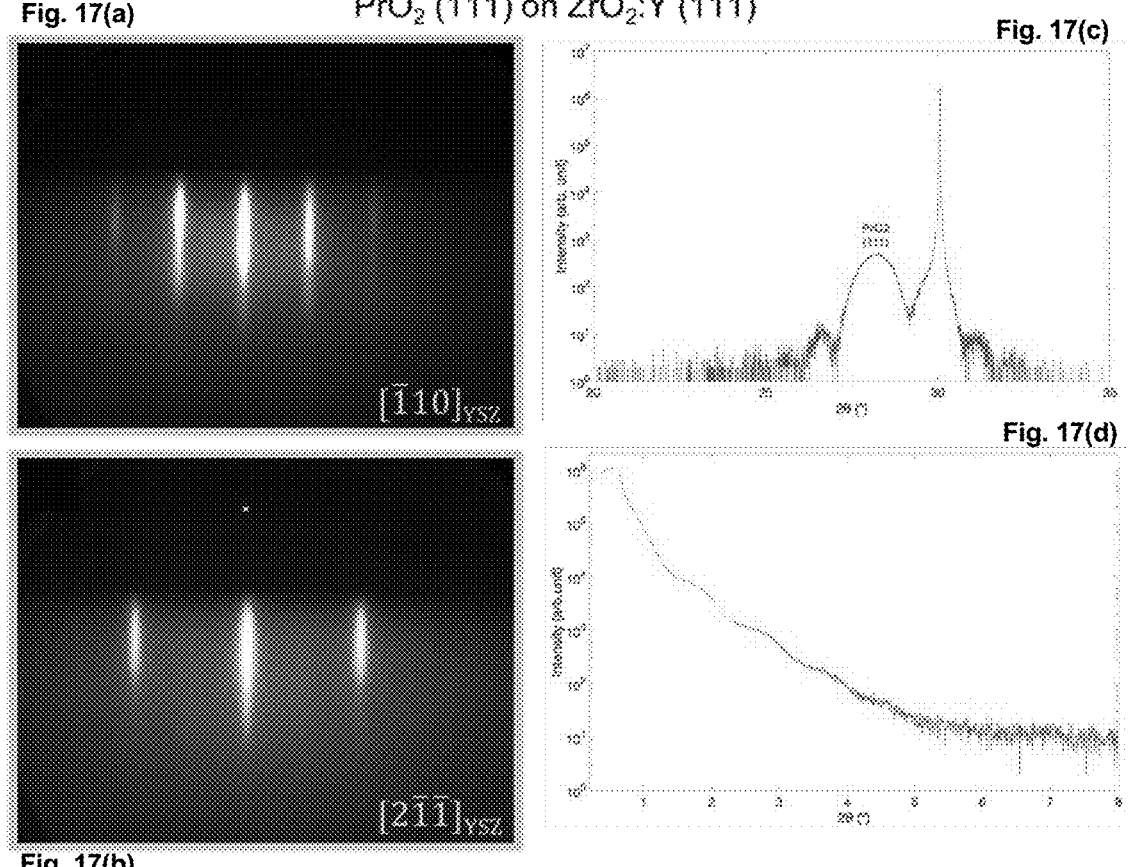
FIGS. 17(*a*)-17(*d*) generally illustrate growth of a $PrO_2$ calibration film.

FIG. 17(a)-17(d) generally illustrate growth of a $PrO_2$ calibration film. FIG. 17(a) and FIG. 17(b) illustrate RHEED patterns along the [110] and [211] azimuths of YSZ. FIG. 17(c) illustrates a $\theta$-2$\theta$ scan and FIG. 17(d) illustrates a x-ray reflectivity scan. The example illustrated corresponds to a 11.1 nm thick $PrO_2$ calibration film.

Figures 18A, 18B, 18C, 18D:
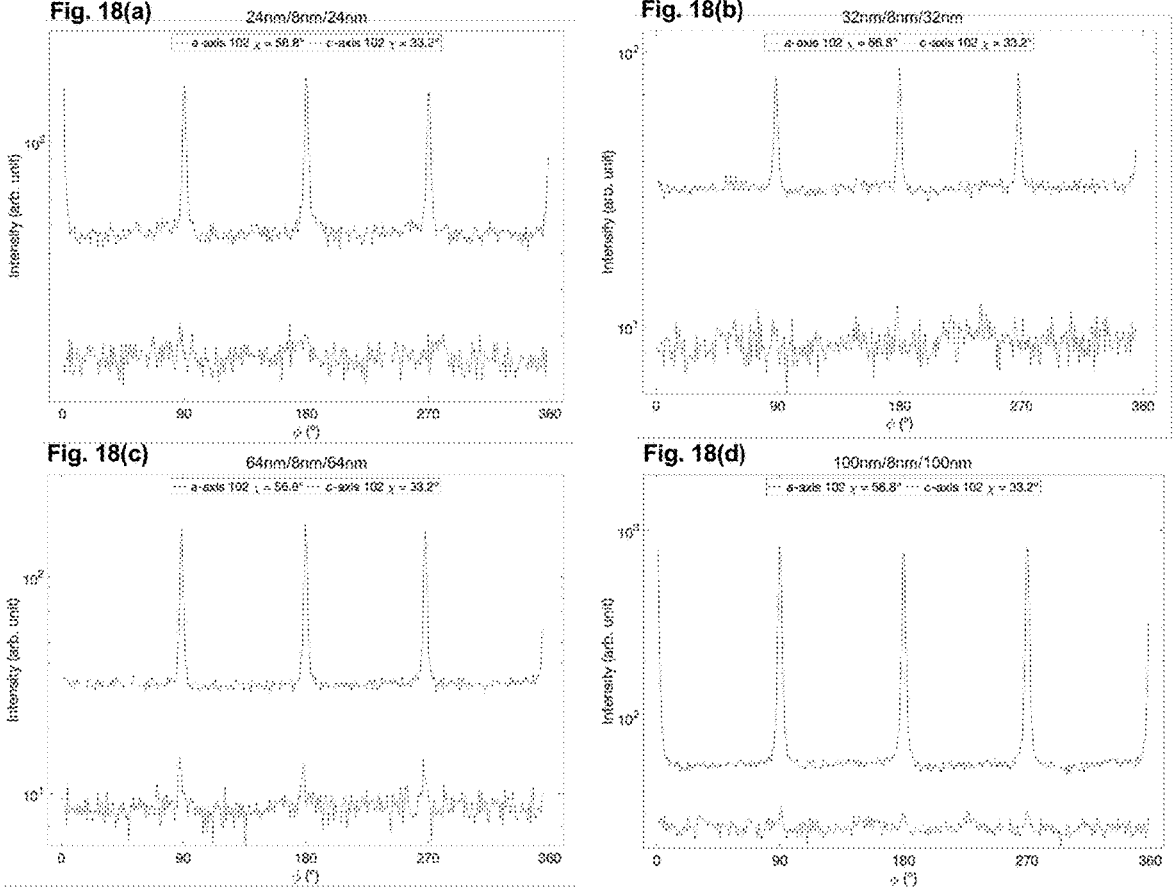
FIGS. 18(*a*)-18(*d*) generally illustrate off-axis φ scans of the 102 family of peaks for different thicknesses of YBCO/PBCO/YBCO trilayers.

FIG. 18(a)-18(d) generally illustrate off-axis $\phi$ scans of the 102 family of peaks at $\chi\approx56.8°$ (red) and $\chi\approx33.2°$ (blue). FIG. 18(a) illustrates a scan for 24 nm/8 nm/24 nm $YBa_2Cu_3O_{7-x}/PrBa_2Cu_3O_{7-x}/YBa_2Cu_3O_{7-x}$ trilayers; FIG. 18(b) illustrates a scan for 32 nm/8 nm/32 nm $YBa_2Cu_3O_{7-x}/PrBa_2Cu_3O_{7-x}/YBa_2Cu_3O_{7-x}$ trilayers; FIG. 18(c) illustrates a scan for 64 nm/8 nm/64 nm $YBa_2Cu_3O_{7-x}/PrBa_2Cu_3O_{7-x}YBa_2Cu_3O_{7-x}$ trilayers; and FIG. 18(d) illustrates a scan for 100 nm/8 nm/100 nm $YBa_2Cu_3O_{7-x}/PrBa_2Cu_3O_{7-x}YBa_2Cu_3O_{7-x}$ trilayers. Peak area integration indicates that the volume fractions of a-axis oriented Y(Pr)$Ba_2Cu_3O_{7-x}$ in these trilayers are 97%, 97%, 96%, and 99%, respectively.

Figures 19A, 19B, 19C, 19D, 19E, 19F:
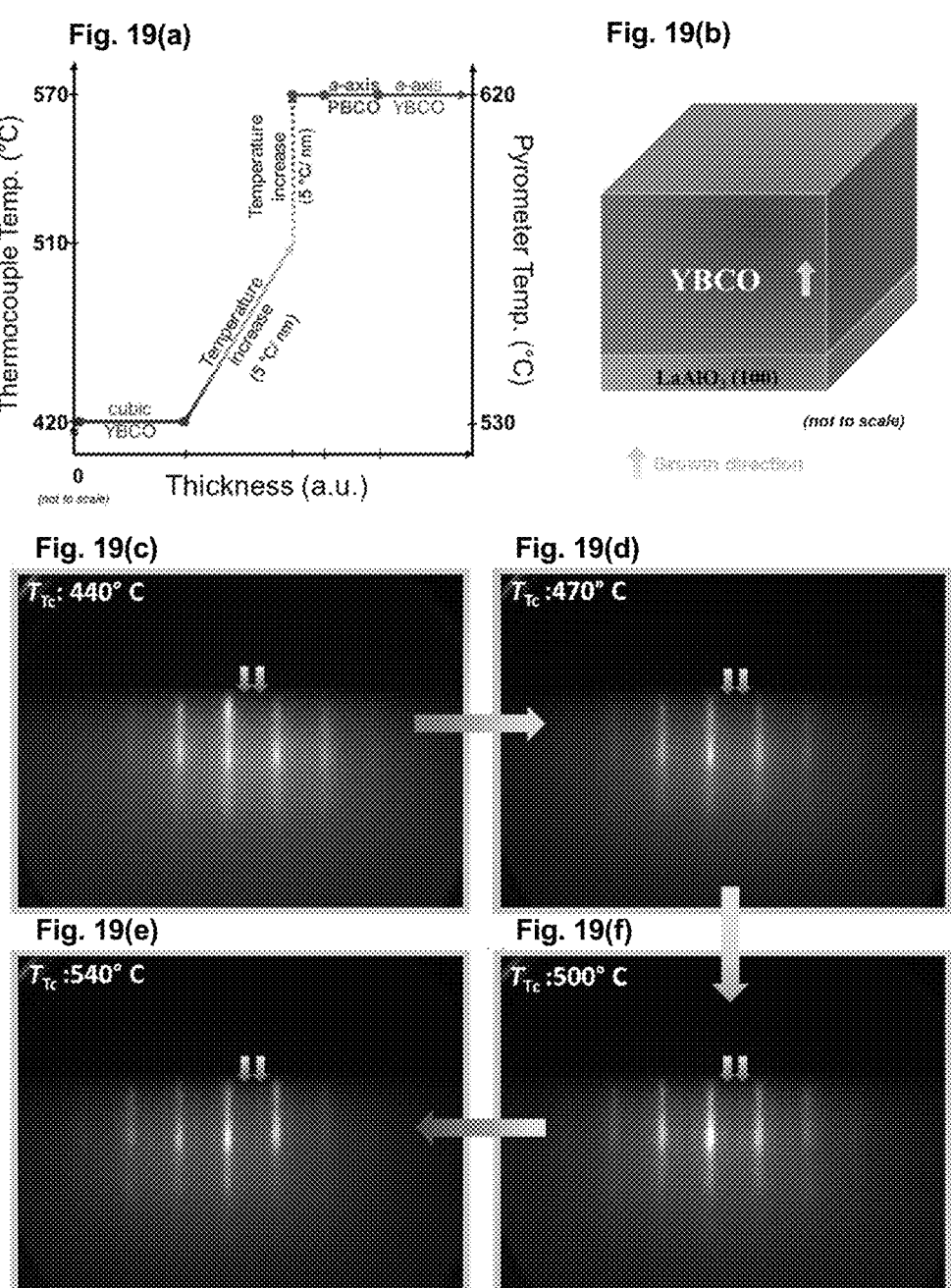
FIGS. 19(*a*)-19(*f*) generally illustrate a temperature ramping procedure and related RHEED patterns.

FIG. 19(a)-19(f) generally illustrate the temperature ramping procedure and related RHEED patterns. FIG. 19(a) illustrates a four-step temperature-ramping method for the growth of the $YBa_2Cu_3O_{7-x}/PrBa_2Cu_3O_{7-x}YBa_2Cu_3O_{7-x}$ trilayers. FIG. 19(b) illustrates a schematic of the $YBa_2Cu_3O_{7-x}$ layer grown on a (100) $LaAlO_3$ substrate. Real-time RHEED images of a single $YBa_2Cu_3O_{7-x}$ layer acquired at four different temperatures during the temperature ramping procedure, i.e., at thermocouple temperatures of $T_{TC}$=440° C. (FIG. 19(c)), $T_{TC}$=470° C. (FIG. 19(d)), $T_{TC}$=500° C. (FIG. 19(e)), and $T_{TC}$=540° C. (FIG. 19(f)). The red arrows added to FIGS. 19(c)-19(f) point to the diffraction streaks associated with the c-axis of the $YBa_2Cu_3O_{7-x}$ lying in-plane. As the temperature is ramped, these streaks become more intense and sharper, demonstrating the enhanced crystalline quality of the a-axis oriented $YBa_2Cu_3O_{7-x}$ film during growth.

Figures 20A, 20B, 20C, 20D:
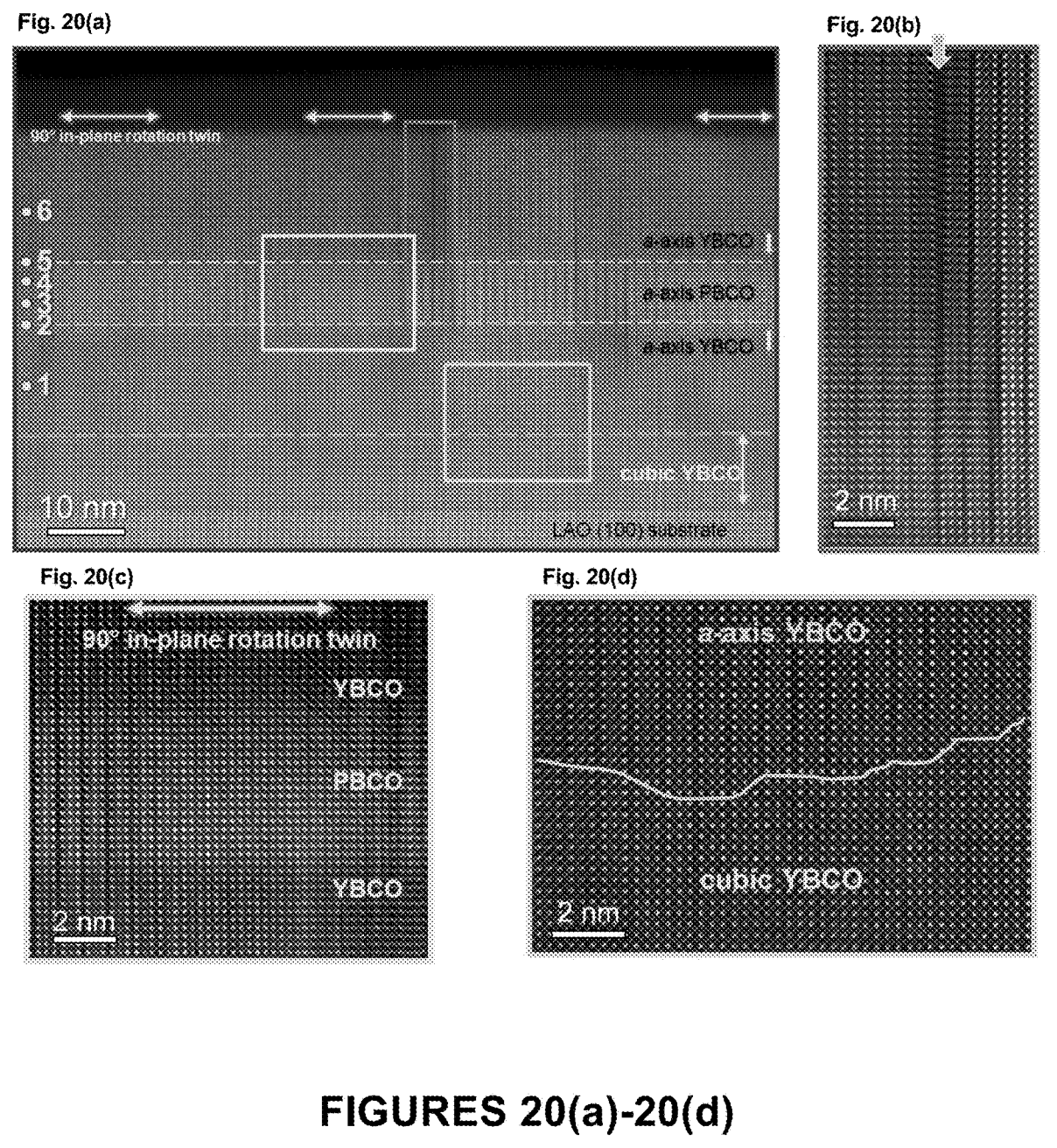

FIG. 20(a) illustrates a representative cross-sectional HAADF-STEM image of the 24 nm/8 nm/24 nm $YBa_2Cu_3O_{7-x}/PrBa_2Cu_3O_{7-x}YBa_2Cu_3O_{7-x}$ trilayer highlighting aspects of the microstructure observed. The six (1-6) pink circles indicate the positions at which the RHEED patterns presented in FIG. 9(a) were taken during growth. The thickness of the cubic (Y,Ba)$CuO_{3-x}$ buffer layer is 10±2 nm. FIG. 20(b) illustrates a high-magnification HAADF-STEM image showing the region of interest highlighted by the green rectangle in FIG. 20(a). The orange arrow indicates the intercalation of an additional CuO layer (dark feature) as a consequence of $YBa_2Cu_4O_{8-x}$ stacking faults with double-chain layers. FIG. 20(c) illustrates the high magnification view of the area highlighted by the gray rectangle in FIG. 20(a) and demonstrates the presence of $YBa_2Cu_3O_{7-x}$ and $PrBa_2Cu_3O_{7-x}$ in-plane rotation twins on top of the cubic $(Y,Ba)CuO_{3-x}$ layer that forms during the "cold" growth. The gray double-sided arrows mark the width of the 90° in-plane rotational twins. FIG. 20(*d*) illustrates the high magnification view of the area highlighted by the pink rectangle in FIG. 20(*a*) and shows the boundary between the cubic $(Y,Ba)CuO_{3-x}$ and the a-axis $YBa_2Cu_3O_{7-x}$ layer, marked by the pink line.

Figures 21A, 21B:
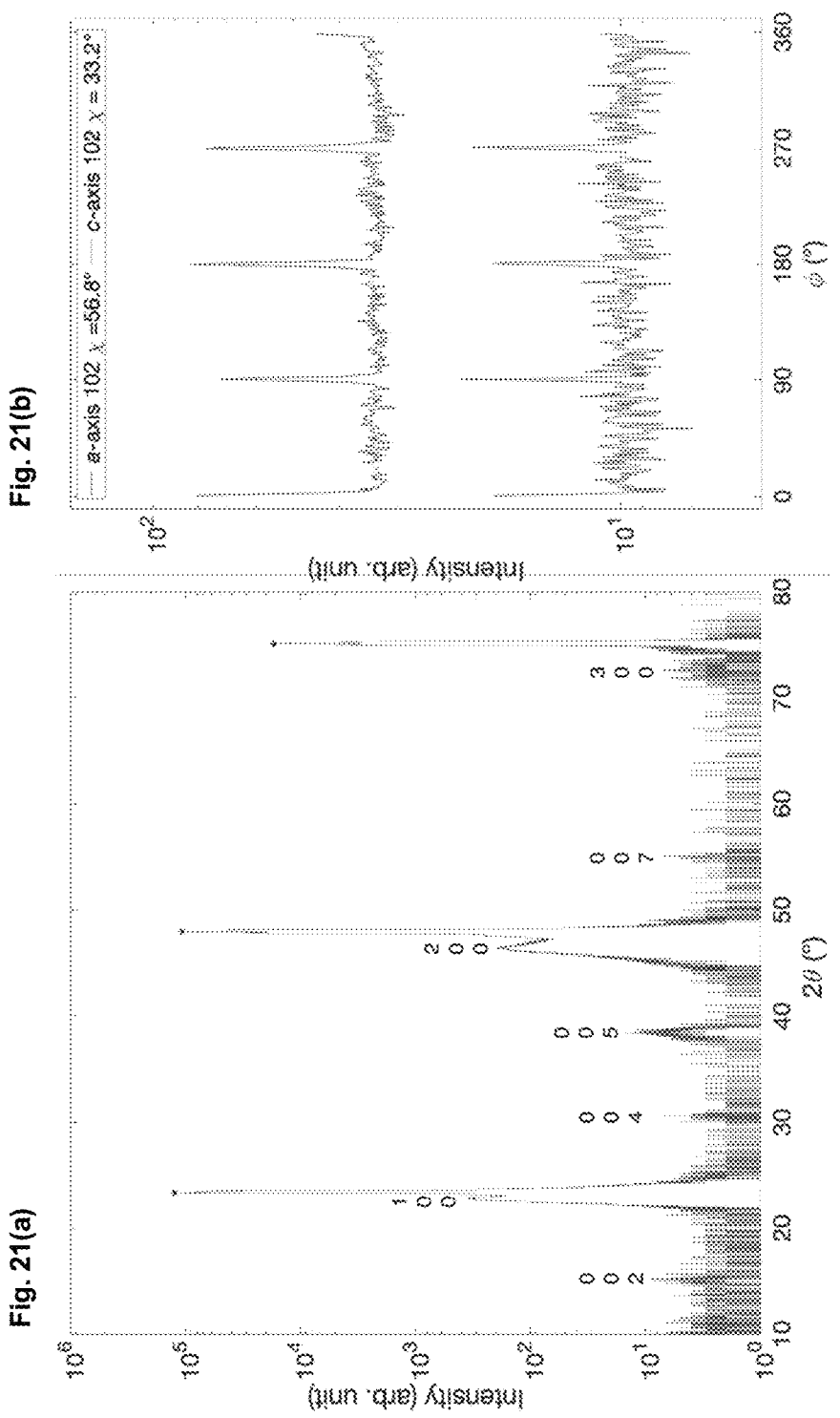
FIGS. 21(*a*)-21(*b*) generally illustrate XRD scans of a less-ideal YBCO/PBCO/YBCO trilayer.

FIG. 21(*a*)-21(*b*) generally illustrate XRD scans of the less-ideal 32 nm/8 nm/32 nm $YBa_2Cu_3O_{7-x}$/PrBa$_2$Cu$_3$O$_{7-x}$YBa$_2$Cu$_3$O$_{7-x}$ trilayer containing a higher concentration of c-axis grains. FIG. 21(*a*) illustrates a θ-2θ scan and FIG. 21(*b*) illustrates an φ scan of the 102 family of peaks at χ≈56.8° (red) and χ≈33.2° (blue) of this less ideal trilayer indicate that it contains a volume fraction of ~84% a-axis $YBa_2Cu_3O_{7-x}$.

Figure 22:
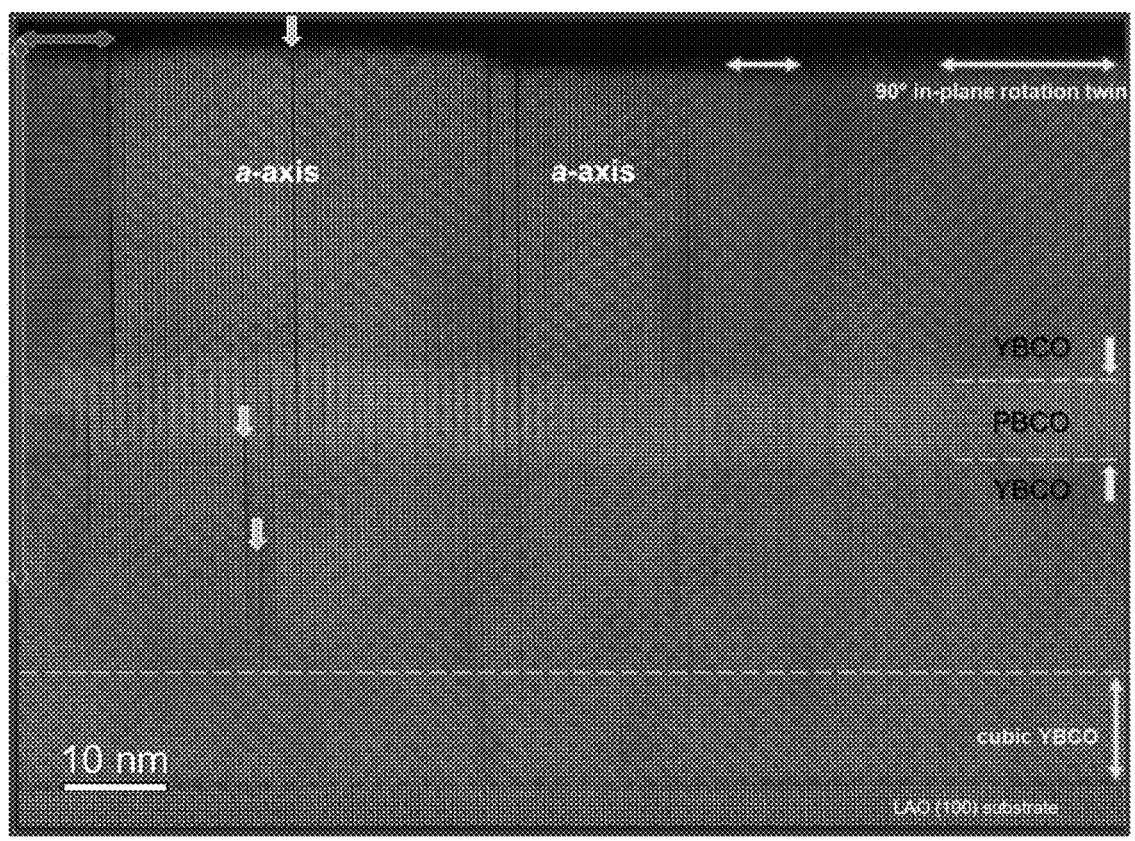
FIG. 22 generally illustrates cross-sectional high-resolution STEM images of a less-ideal YBCO/PBCO/YBCO trilayer.

FIG. 22 illustrates a representative cross-sectional HAADF-STEM image of the less-ideal 32 nm/8 nm/32 nm $YBa_2Cu_3O_{7-x}$/PrBa$_2$Cu$_3$O$_{7-x}$/YBa$_2$Cu$_3$O$_{7-x}$ trilayer showing increased roughness, c-axis and a-axis domains as well as $YBa_2Cu_4O_{8-x}$ stacking faults (dark lines), and a cubic $(Y,Ba)$ $CuO_{3-x}$ buffer layer. The red arrows mark the c-axis domain that starts from the bottom cubic $(Y,Ba)CuO_{3-x}$ layer. The orange arrows indicate some of the $YBa_2Cu_4O_{8-x}$ stacking faults (features with darker contrast). The gray double-ended arrows mark the width of examples of 90° in-plane rotational twins in which the c-axis is oriented into the plane of the image. The thickness of the cubic-$(Y,Ba)CuO_{3-x}$ buffer layer is 11±2 nm.

Figures 23, 23A, 23B, 23C, 23D, 23E, 23F, 23G:
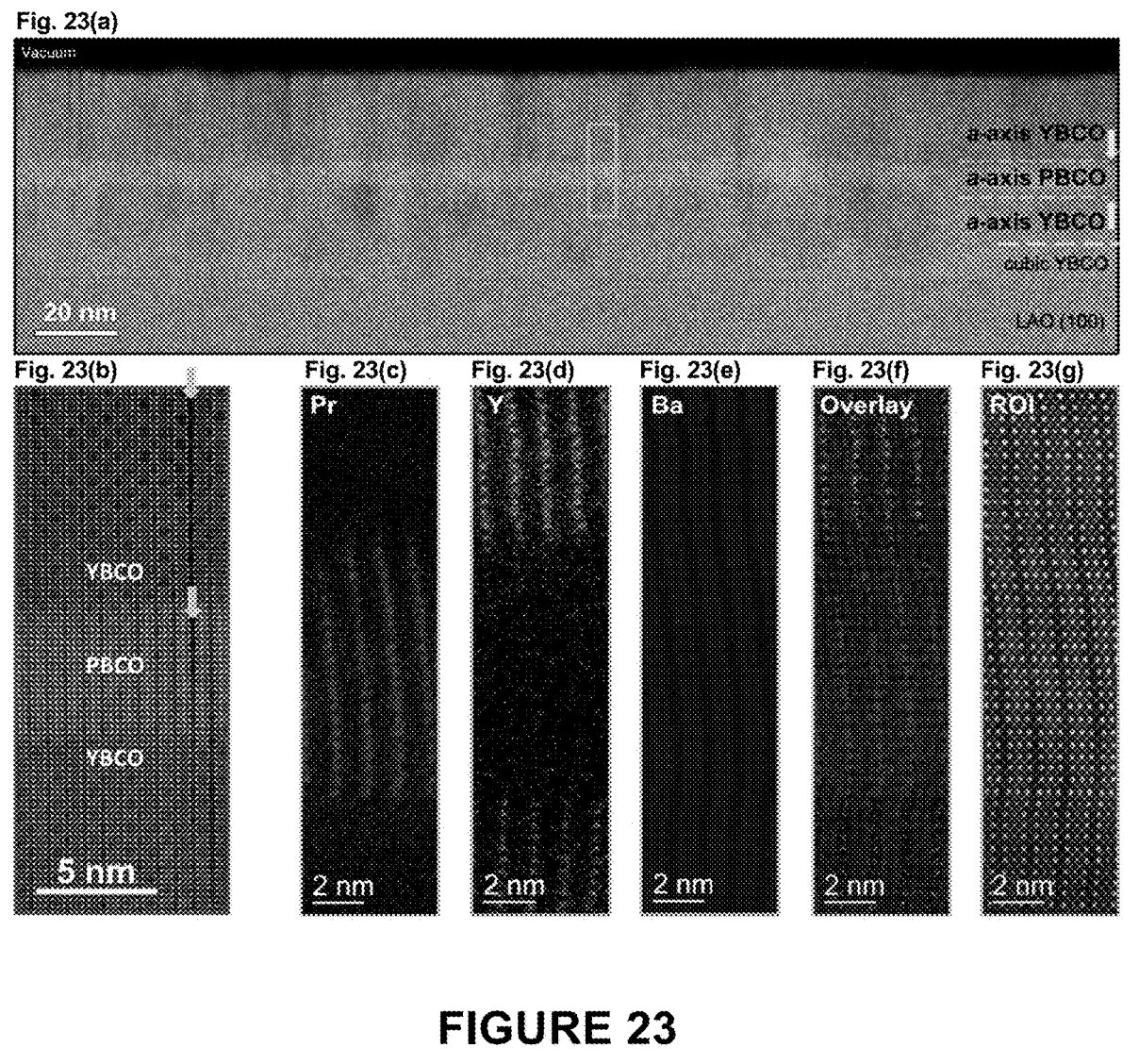

FIG. 23(*a*) illustrates a low-magnification cross-sectional HAADF-STEM image of the same less-ideal 32 nm/8 nm/32 nm $YBa_2Cu_3O_{7-x}$/PrBa$_2$Cu$_3$O$_{7-x}$/YBa$_2$Cu$_3$O$_{7-x}$ trilayer exhibiting increased roughness. Individual $YBa_2Cu_3O_{7-x}$ and PrBa$_2$Cu$_3$O$_{7-x}$ layers are separated using dashed lines and the pink arrows indicate the nominal interfaces.

FIG. 23(*b*) illustrates the high-magnification scan of a representative region demonstrates fairly abrupt interfaces and $YBa_2Cu_4O_{8-x}$ stacking faults as marked with orange arrows that either originate from the underlying $YBa_2Cu_3O_{7-x}$ or PrBa$_2$Cu$_3$O$_{7-x}$ layers. FIGS. 23(*c*)-23(*e*) illustrates atomically resolved Pr-M$_{5,4}$ edge (red), Y-L$_{3,2}$ edge (green), and Ba-M$_{5,4}$ edge (blue) elemental maps evidencing the sharp chemical abruptness of the interfaces. FIG. 23(*f*) illustrates the RGB overlay and FIG. 23(*g*) illustrates the simultaneously acquired ADF-STEM image showing this same region highlighted by the tan rectangle in FIG. 23(*a*).

Example 2

An example of achieving low surface roughness for a-axis XBCO in accordance with various implementations of the invention, and the evaluation of such a-axis XBCO is described in a document entitled "a-axis $YBa_2Cu_3O_{7-x}$/PrBa$_2$Cu$_3$O$_{7-x}$/YBa$_2$Cu$_3$O$_{7-x}$ trilayers with subnanometer rms roughness," and in a document entitled "Supplementary Material, a-axis $YBa_2Cu_3O_{7-x}$/PrBa$_2$Cu$_3$O$_{7-x}$/YBa$_2$Cu$_3$O$_{7-x}$ trilayers with subnanometer rms roughness," (collectively "Smoothness Documents") each of which was included as Appendix Y of U.S. Provisional Application No. 63/105, 230, entitled "A-axis Josephson Junctions with Improved Smoothness," filed on Oct. 24, 2020, which is one of the priority applications incorporated above. Growth temperature profile 800 and its associated temperatures appear to differ from corresponding profiles and temperatures in the Smoothness Documents because temperatures of growth temperature profile 800 are thermocouple temperatures whereas the temperatures described in the Smoothness Documents are pyrometer temperatures. As would be appreciated, these are two entirely different ways to measure temperature with each having its own inaccuracies. Despite the appearances due to different measurement sensors/techniques, actual temperatures are entirely consistent with one another.

In this example, a-axis $YBa_2Cu_3O_{7-x}$/PrBa$_2$Cu$_3$O$_{7-x}$/ $YBa_2Cu_3O_{7-x}$ trilayers are grown on (100) LaAlO$_3$ substrates with improved interface smoothness. The trilayers are synthesized by ozone-assisted molecular-beam epitaxy. The thickness of the PrBa$_2$Cu$_3$O$_{7-x}$ layer is held constant at 8 nm and the thickness of the $YBa_2Cu_3O_{7-x}$ layers is varied from 24 nm to 100 nm. X-ray diffraction measurements show all trilayers to have >95% a-axis content. The rms roughness of the thinnest trilayer is <0.7 nm and this roughness increases with the thickness of the $YBa_2Cu_3O_{7-x}$ layers. The thickness of the $YBa_2Cu_3O_{7-x}$ layers also affects the transport properties: while all samples exhibit an onset of the superconducting transition at and above 85 K, the thinner samples show wider transition widths, $\Delta T_c$. High-resolution scanning transmission electron microscopy reveals coherent and chemically sharp interfaces, and that growth begins with a cubic $(Y,Ba)CuO_{3-x}$ perovskite phase that transforms into a-axis oriented $YBa_2Cu_3O_{7-x}$ as the substrate temperature is ramped up.

$YBa_2Cu_3O_{7-x}$/PrBa$_2$Cu$_3$O$_{7-x}$/YBa$_2$Cu$_3$O$_{7-x}$ trilayers with 24 nm, 32 nm, 64 nm, and 100 nm thick $YBa_2Cu_3O_{7-x}$ layers, in which the PrBa$_2$Cu$_3$O$_{7-x}$ layer thickness is kept constant at 8 nm, were grown on 10 mm×10 mm (100)-oriented LaAlO$_3$ substrates by ozone-assisted MBE as illustrated in FIG. 9(*a*). Although high quality a-axis $YBa_2Cu_3O_{7-x}$ films have been grown on (100) LaSrGaO$_4$ substrates, (100) LaAlO$_3$ substrates were used here to identify a path that can be scaled to large diameters to enable its translation to a viable technology. 3-inch diameter LaAlO$_3$ substrates are currently available; in the past, even 4-inch diameter LaAlO$_3$ substrates were commercially produced.

The $YBa_2Cu_3O_{7-x}$/PrBa$_2$Cu$_3$O$_{7-x}$/YBa$_2$Cu$_3$O$_{7-x}$ trilayers were synthesized in a Veeco GEN10 MBE. Yttrium (99.6%), barium (99.99%), praseodymium (99.1%), and copper (99.99%) were evaporated from thermal effusion cells with fluxes of $1.1\times10^{13}$ cm$^{-2}$s$^{-1}$, $2.2\times10^{13}$ cm$^{-2}$s$^{-1}$, and $3.3\times10^{13}$ cm$^{-2}$s$^{-1}$, respectively. Prior to growth, the (100) LaAlO$_3$ substrates (CrysTec GmbH) were etched in boiling water, annealed at 1300° C. in air for 10 hours, and then etched again in boiling water, to obtain an AlO$_2$-terminated surface with a step-and-terrace morphology. Following this surface treatment, the backside of the (100) LaAlO$_3$ substrates were coated with a 10 nm thick titanium adhesion layer followed by 200 nm of platinum, enabling the otherwise transparent substrates to be radiatively heated during MBE growth. The $YBa_2Cu_3O_{7-x}$ (or PrBa$_2$Cu$_3$O$_{7-x}$) layers were grown by simultaneously depositing yttrium (or praseodymium), barium, and copper onto the heated substrate under a continuous flux of distilled ozone (~80% O$_3$+20% O$_2$) yielding a background pressure of $1\times10^{-6}$ Torr. After growth, the samples were cooled to under 100° C. in the same pressure of distilled ozone in which they were grown before turning off the ozone molecular beam and removing the samples from vacuum.

Because $YBa_2Cu_3O_{7-x}$ is a point compound that is unable to accommodate appreciable off-stoichiometry, flux calibration presents a significant challenge where secondary impurity phases nucleate easily and significantly degrade film quality. As discussed above, the flux of each element was separately calibrated by growing binary oxides of the constituents, namely Y$_2$O$_3$, PrO$_2$,BaO, and CuO. From these separate binary flux calibrations, the temperatures of the effusion cells containing yttrium, barium, praseodymium, and copper was adjusted to match the desired 1:2:3 flux ratio among Y(Pr):Ba:Cu. The temperature of the substrate was measured during growth by a thermocouple ($T_{Tc}$) that was positioned close to, but not in direct contact with the substrate, and by an optical pyrometer ($T_{Pyr}$) operating at a wavelength of 1550 nm. The growth of the trilayers started at low-temperature, $T_{Tc}$=420° C. ($T_{Pyr}$=530° C.), resulting in a cubic perovskite (Y,Ba)CuO$_{3-x}$ phase for the first few layers and ended at $T_{Tc}$=570° C. ($T_{Pyr}$=620° C.) following a temperature-ramping procedure. Details of the flux calibration method (including the characterization of individual binary oxides) are illustrated in FIGS. 14-18. The temperature-ramping details and the in-situ reflection high-energy electron diffraction (RHEED) characterization of a reference a-axis YBa$_2$Cu$_3$O$_{7-x}$ single-phase film grown as part of the optimization of the growth procedure are illustrated in FIG. 19.

During growth, the films were monitored by in-situ RHEED with KSA-400 software and a Staib electron gun operating at 13 kV and 1.45 A. RHEED images taken during the growth of the 24 nm YBa$_2$Cu$_3$O$_{7-x}$/8 nm PrBa$_2$Cu$_3$O$_{7-x}$/24 nm YBa$_2$Cu$_3$O$_{7-x}$ trilayer are illustrated in FIGS. 9(b)-9(g). The structural quality and the a-axis/c-axis ratio of the samples was explored using a PANalytical Empyrean x-ray diffractometer (XRD) at 45 kV and 40 mA with Cu Kai radiation (1.54057 Å). For surface morphological characterization of the films, ex situ atomic force microscopy (AFM) measurements were conducted using an Asylum Cypher ES Environmental AFM system. Resistance as a function of temperature measurements were carried out using a homemade four-point van der Pauw geometry system that slowly dips the samples into a Dewar of liquid helium.

Detailed investigations of the films were conducted using atomic-resolution scanning transmission electron microscopy (STEM). Cross-sectional TEM specimens were prepared by focused ion beam (FIB) lift-out with a Thermo Fisher Helios G4 UX Dual Beam system. The samples were imaged on an aberration-corrected FEI Titan Themis at 300 kV. STEM high-angle annular dark-field (HAADF) imaging was performed with a probe convergence semi-angle of 21.4 mrad and inner and outer collection angles from 68-340 mrad. STEM electron energy loss spectroscopy (EELS) measurements were performed on the same Titan system equipped with a 965 GIF Quantum ER and Gatan K2 Summit direct detector operated in electron counting mode, with a beam current of ~50 pA and scan times of 2.5 or 5 ms per 0.4 Å pixel. A multivariate weighted principal component analysis routine (MSA Plugin in Digital Micrograph) was used to decrease the noise level in STEM data.

Figures 9A, 9B, 9C, 9D, 9E, 9F, 9G:
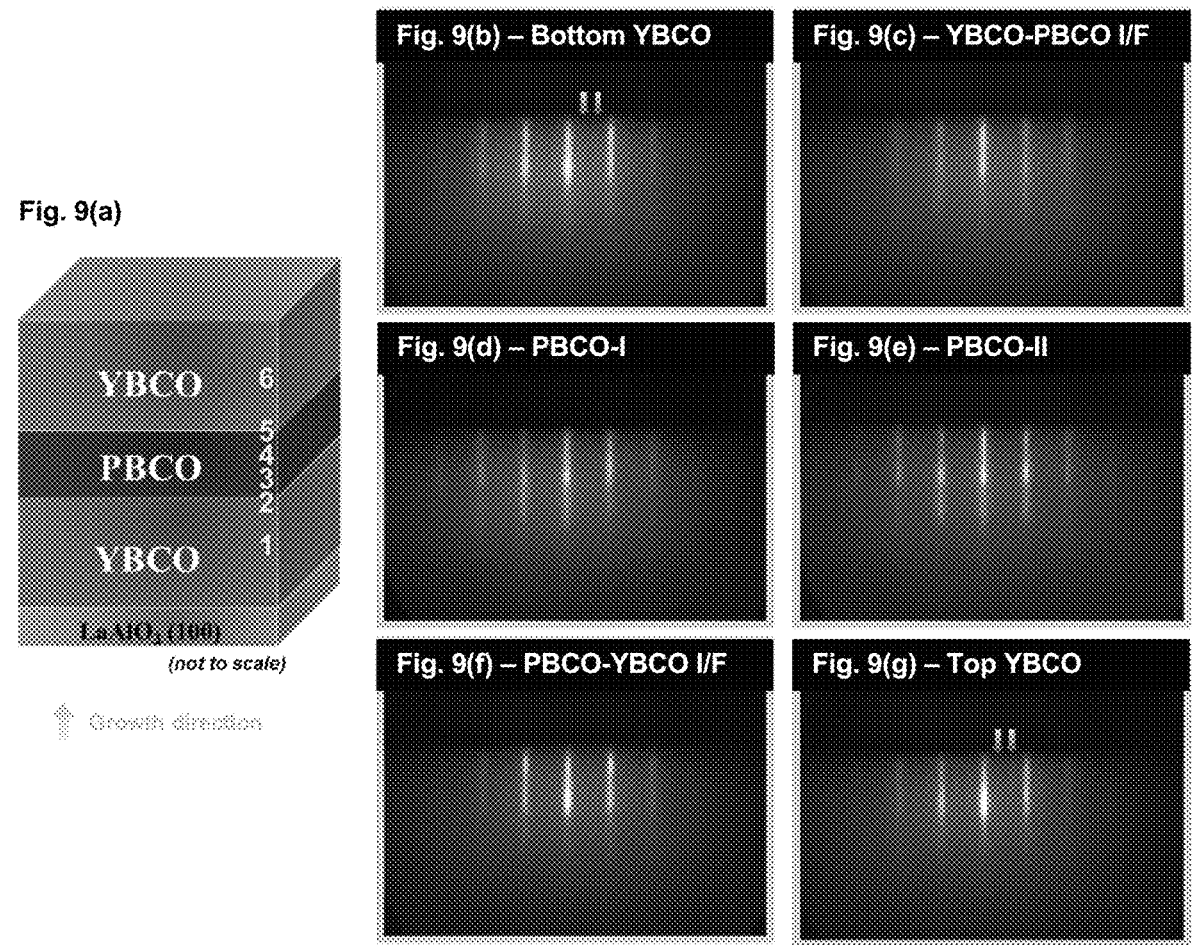
FIGS. 9(*a*)-9(*g*) illustrate YBCO/PBCO/YBCO trilayers grown on a substrates and their associated RHEED images.

FIG. 9(a) illustrates the YBa$_2$Cu$_3$O$_{7-x}$/PrBa$_2$Cu$_3$O$_{7-x}$/YBa$_2$Cu$_3$O$_{7-x}$ trilayers grown on (100) LaAlO$_3$ substrates. FIGS. 9(b)-9(g) illustrate real-time RHEED images acquired along the [010] azimuth of the (100) LaAlO$_3$ substrate during the growth of the 24 nm YBa$_2$Cu$_3$O$_{7-x}$/8 nm PrBa$_2$Cu$_3$O$_{7-x}$/24 nm YBa$_2$Cu$_3$O$_{7-x}$ trilayer at the six different levels illustrated in FIG. 9(a). FIG. 9(b) illustrates the RHEED pattern from the bottom YBa$_2$Cu$_3$O$_{7-x}$ layer; FIG. 9(c) illustrates the RHEED pattern at the YBa$_2$Cu$_3$O$_{7-x}$/PrBa$_2$Cu$_3$O$_{7-x}$ interface; FIGS. 9(d)-9(e) illustrate the RHEED pattern for the PrBa$_2$Cu$_3$O$_{7-x}$ layer at different growth levels; FIG. 9(f) illustrates the RHEED pattern at the PrBa$_2$Cu$_3$O$_{7-x}$/YBa$_2$Cu$_3$O$_{7-x}$ interface; and FIG. 9(g) illustrates the RHEED pattern at the top YBa$_2$Cu$_3$O$_{7-x}$ layer. The red arrows added to FIGS. 9(b) and 9(g) point to the diffraction streaks associated with the c-axis of the YBa$_2$Cu$_3$O$_{7-x}$ lying in-plane.

Figures 10A, 10B, 10C:
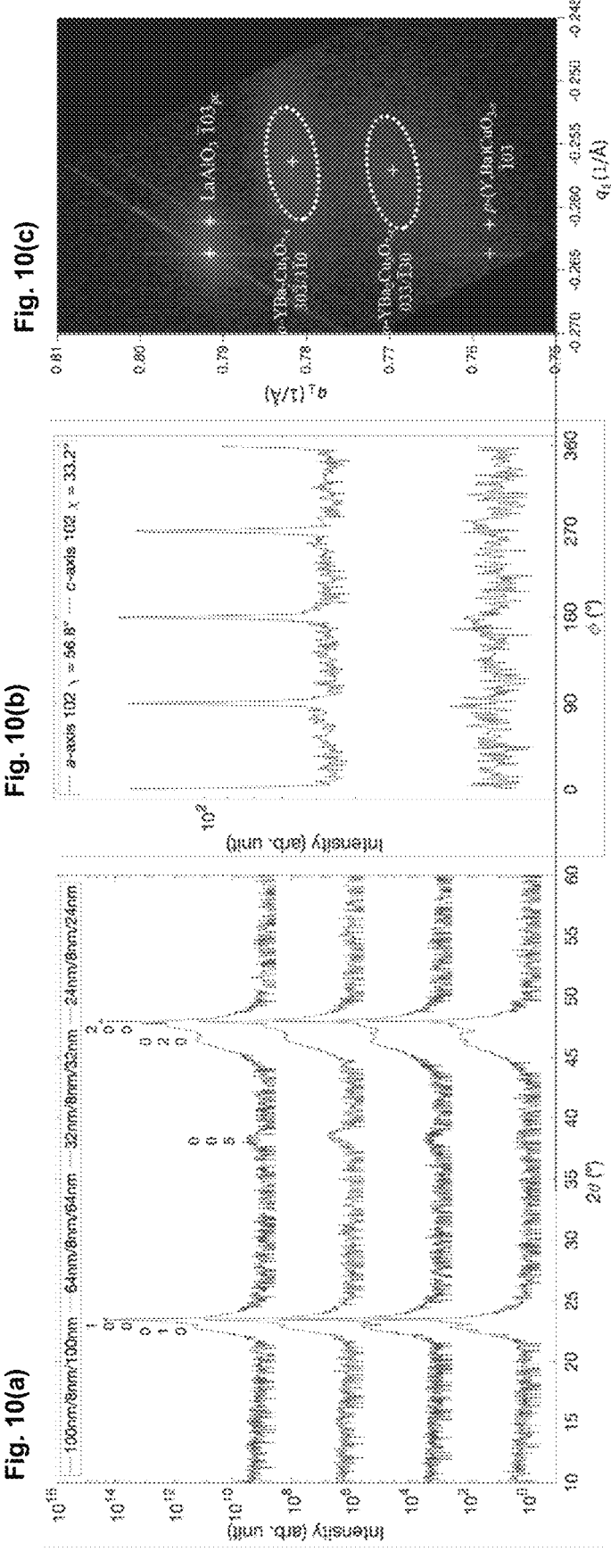
FIGS. 10(*a*)-10(*c*) generally illustrate x-ray diffraction of YBCO/PBCO/YBCO trilayers.

The structural quality of the samples was assessed by XRD measurements. Generally, FIGS. 10(a)-10(c) illustrate X-ray diffraction of YBa$_2$Cu$_3$O$_{7-x}$/PrBa$_2$Cu$_3$O$_{7-x}$/YBa$_2$Cu$_3$O$_{7-x}$ trilayers with 24 nm, 32 nm, 64 nm, and 100 nm thick YBa$_2$Cu$_3$O$_{7-x}$ layers. In FIG. 10(a), θ-2θ scans of the trilayers show only h00, 0k0, and 00l reflections. In FIG. 10(b), off-axis 102 reflection φ scans at χ≈56.6° (red) and χ≈33.4° (blue) of the trilayer with 24 nm thick YBa$_2$Cu$_3$O$_{7-x}$ layers showing the absence of c-axis grains. In FIG. 10(c), RSM around the LaAlO$_3$ $\overline{1}$03 reflection (pseudocubic) of this same trilayer with 24 nm thick YBa$_2$Cu$_3$O$_{7-x}$ layers showing the a-axis and b-axis orthorhombic 30$\overline{3}$/3$\overline{1}$0 and 033/$\overline{1}$30 reflections of YBa$_2$Cu$_3$O$_{7-x}$, as well as the perovskite (Y,Ba)CuO$_{3-x}$ 103 reflection. The positions of these film reflections are indicated by the "+" symbols and dashed ellipses near the corresponding reflection labels.

In the coupled θ-2θ XRD scans in FIG. 10(a), only h00, 0k0, and 00l reflections of the YBa$_2$Cu$_3$O$_{7-x}$ and PrBa$_2$Cu$_3$O$_{7-x}$ phases were indexed, indicating that the film only contains phases with the desired stoichiometry; they were free of impurity phases associated with off-stoichiometry. With increasing YBa$_2$Cu$_3$O$_{7-x}$ layer thicknesses, 00l reflections emerged showing the nucleation and propagation of c-axis grains in the films. Off-axis φ scans of the 102 family of reflections of the orthorhombic YBa$_2$Cu$_3$O$_{7-x}$/PrBa$_2$Cu$_3$O$_{7-x}$ at χ≈56.6° and χ≈33.4° were used to measure the a-axis and c-axis content of the orthorhombic grains, respectively. Note that χ≈90 aligned the diffraction vector to be perpendicular to the plane of the substrate. In the 102 φ scan of the trilayer sample illustrated in FIG. 10(b), four peaks associated with the a-axis grains were observed corresponding to 90° in-plane rotational twinning: the c-axis of the YBa$_2$Cu$_3$O$_{7-x}$ and PrBa$_2$Cu$_3$O$_{7-x}$ was aligned parallel to the [010] direction of the (100) LaAlO$_3$ substrate in one set of twin domains and parallel to the [001] direction of the (100) LaAlO$_3$ substrate in the other set of twin domains. No intensity associated with c-axis grains was observed indicating that the film contained no c-axis grains within the resolution of our XRD scan. The off-axis φ scans of all trilayer samples illustrated in FIG. 18 indicate that all four trilayers have more than 95% a-axis content in the Y(Pr)Ba$_2$Cu$_3$O$_{7-x}$ orthorhombic phase. In addition to the orthorhombic phases, a cubic perovskite phase was also observed. This phase has been previously reported in the literature as a low-temperature, kinetically-stabilized l-centered cubic phase or primitive simple-cubic phase. The formation of this phase and its role in stabilizing the a-axis YBa$_2$Cu$_3$O$_{7-x}$/PrBa$_2$Cu$_3$O$_{7-x}$/YBa$_2$Cu$_3$O$_{7-x}$ trilayers is discussed below in tandem with its observation by HAADF-STEM. In the reciprocal space map (RSM) around the LaAlO$_3$ 103 reflection (pseudocubic) in FIG. 10(c), a perovskite-like $\overline{1}$03 reflection (denoted p-(Y,Ba)CuO$_{3-x}$) and the orthorhombic phase 30$\overline{3}$/3$\overline{1}$0 and 033/$\overline{1}$30 reflections associated with the a-axis and b-axis YBa$_2$Cu$_3$O$_{7-x}$ grains, respectively, were observed.

Figures 11A, 11B, 11C, 11D, 11E:
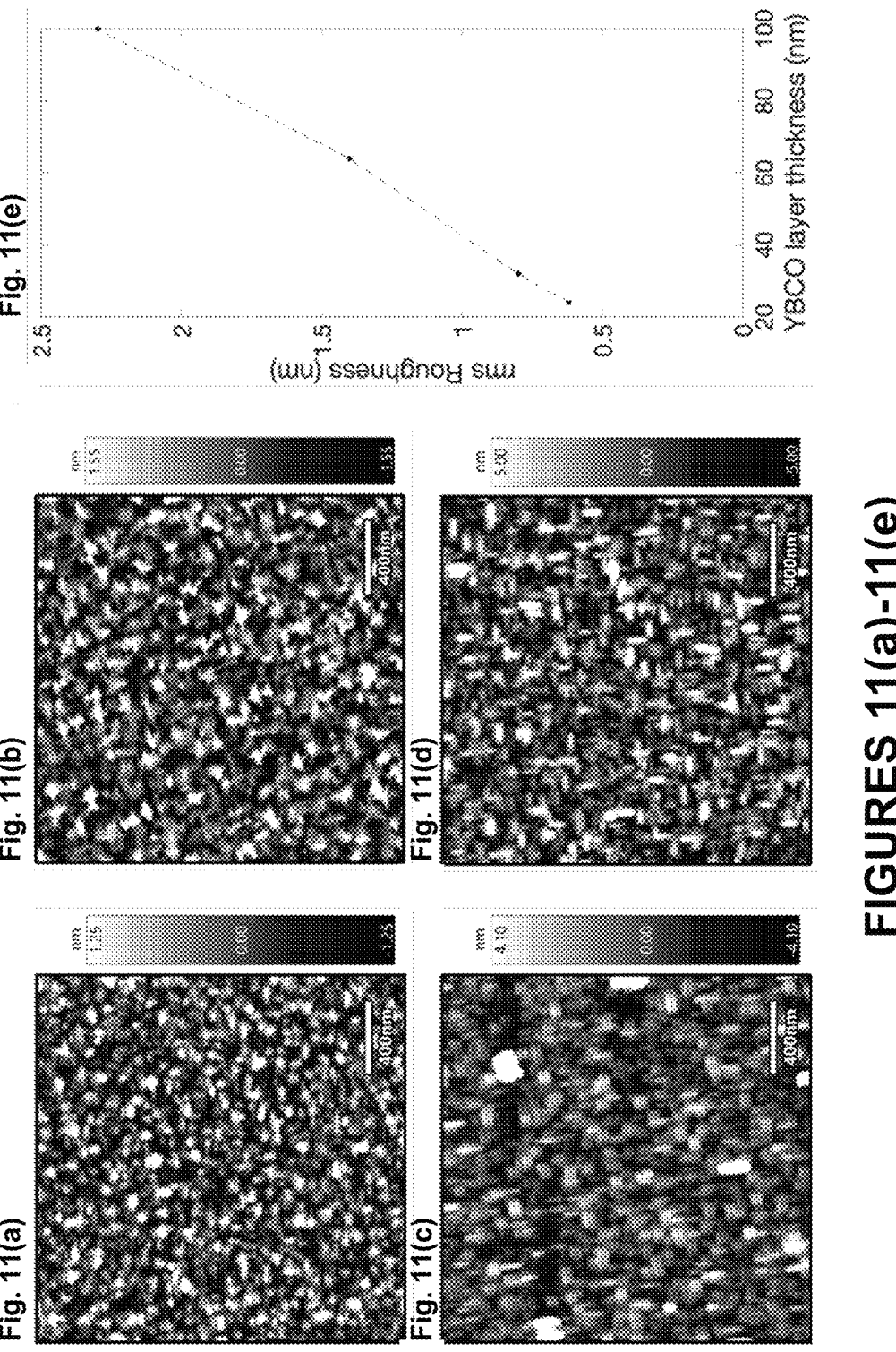
FIGS. 11(*a*)-11(*e*) generally illustrate surface morphology of the YBCO/PBCO/YBCO trilayers as revealed by AFM.

The surface morphologies of the same as-grown YBa$_2$Cu$_3$O$_{7-x}$/PrBa$_2$Cu$_3$O$_{7-x}$/YBa$_2$Cu$_3$O$_{7-x}$ trilayers were established by ex situ AFM in tapping mode. With increasing YBa$_2$Cu$_3$O$_{7-x}$ layer thickness, the elongated YBa$_2$Cu$_3$O$_{7-x}$ grains as well as the in-plane 90° rotational twinning of these rectangular-shaped features became visible in the 2 μm×2 μm topography scans as illustrated in FIGS. 11(a)-11(e). FIG. 11 generally illustrates surface morphology of the YBa$_2$Cu$_3$O$_{7-x}$/PrBa$_2$Cu$_3$O$_{7-x}$/

$YBa_2Cu_3O_{7-x}$ trilayers revealed by AFM. FIGS. 11(a)-11(d) illustrate 2 μm×2 μm topography scans of the 24 nm/8 nm/24 nm, 32 nm/8 nm/32 nm, 64 nm/8 nm/64 nm, and 100 nm/8 nm/100 nm trilayers in tapping mode, respectively. FIG. 11(e) illustrates rms roughness calculated from FIG. 11(a)-11(d) as a function of the $YBa_2Cu_3O_{7-x}$ layer thickness. The dotted line serves as a guide for the eye.

The surface morphology arose from the much slower growth rate of $YBa_2Cu_3O_{7-x}$ grains along [001] than in the (001) plane. The root-mean-square (rms) roughness also increased with increasing $YBa_2Cu_3O_{7-x}$ layer thickness from 0.62 nm in the thinnest 24 nm/8 nm/24 nm trilayer to 2.3 nm in the thickest 100 nm/8 nm/100 nm trilayer. Surface roughness is an important metric affecting the yield and electrical performance of $YBa_2Cu_3O_{7-x}$-based JJs involving extrinsic interfaces, i.e., tunnel barriers. The 0.62 nm rms roughness observed is the smoothest reported in the literature and a significant reduction from the 11.3 nm previously known on a-axis $YBa_2Cu_3O_{7-x}/PrBa_2Cu_3O_{7-x}$ bilayers with 270 nm thick $YBa_2Cu_3O_{7-x}$ layers grown on (100) $LaAlO_3$ substrate.

Figures 12A, 12B, 12C:
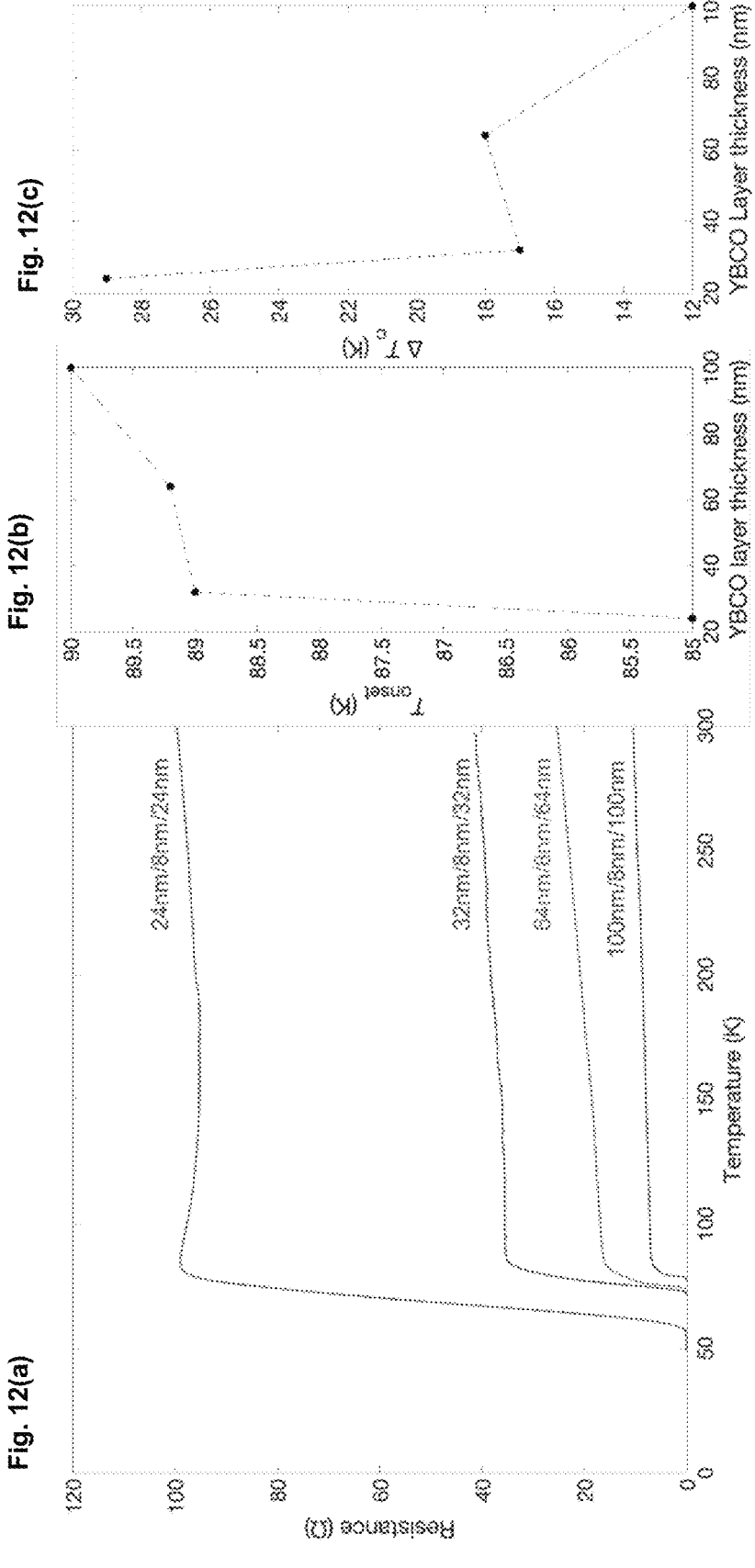
FIGS. 12(*a*)-12(*c*) generally illustrate transport properties of the YBCO/PBCO/YBCO trilayers.

FIGS. 12(a)-12(c) generally illustrate the transport properties of the same $YBa_2Cu_3O_{7-x}/PrBa_2Cu_3O_{7-x}/$ $YBa_2Cu_3O_{7-x}$ trilayers. As is evident from the resistance versus temperature (R-T) plots in FIG. 12(a), all trilayers were found to superconduct.

As illustrated in FIG. 12(b), the normal state resistance decreased and the onset temperature of the superconducting transition ($T_{onset}$) increased with increasing $YBa_2Cu_3O_{7-x}$ layer thickness—from 85 K for the 24 nm/8 nm/24 nm trilayer to 90 K for the 100 nm/8 nm/100 nm trilayer. (The dashed lines in FIGS. 12(b)-12(c) are guides to the eye). $T_{onset}$ refers to the temperature at which the resistance falls below a linear extrapolation of the R vs. T behavior from its slope in the 200-300 K regime. The superconducting transition width ($\Delta T_c$), referred to here as the temperature difference between $T_{onset}$ and the temperature at which the resistance is zero (within the noise of our measurement), $\Delta T_c$, decreased with increasing $YBa_2Cu_3O_{7-x}$ layer thickness from 29 K for the 24 nm/8 nm/24 nm trilayer to 10 K for the 100 nm/8 nm/100 nm trilayer, as illustrated in FIG. 12(c). Compared to c-axis $YBa_2Cu_3O_{7-x}$ films, however, these transition widths are still relatively broad. Such behavior is ubiquitous in twinned a-axis $YBa_2Cu_3O_{7-x}$ films especially when the thickness of the a-axis $YBa_2Cu_3O_{7-x}$ is under 100 nm. This may arise from local disorder and inhomogeneities in the samples, insufficient oxidation, or from the degradation of the samples over time.

Figures 13A, 13B, 13C, 13D, 13E, 13F, 13G:
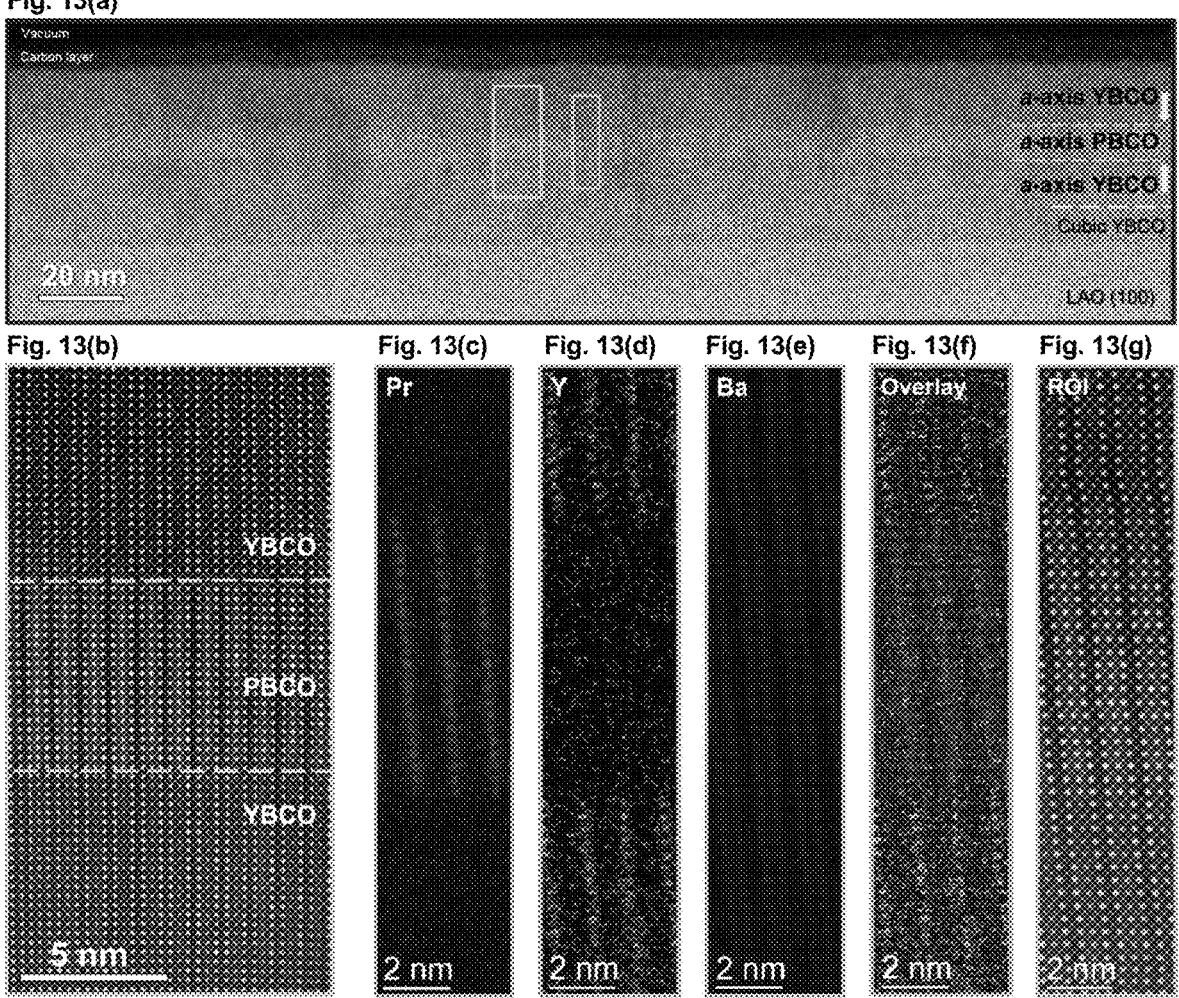
FIGS. 13(*a*)-13(*g*) generally illustrate cross-sectional high-resolution STEM images that reveal a microstructure and interface abruptness of the YBCO/PBCO/YBCO trilayers.

Two trilayer samples were studied with cross-sectional high-resolution STEM to reveal the microstructure and interface abruptness of the samples as illustrated in FIG. 13. FIG. 13(a) illustrates a low-magnification cross-sectional HAADF-STEM image of the 24 nm/8 nm/24 nm $YBa_2Cu_3O_{7-x}/PrBa_2Cu_3O_{7-x}/YBa_2Cu_3O_{7-x}$ trilayer revealing the microstructure and interface abruptness at the atomic scale. Individual $YBa_2Cu_3O_{7-x}$ and $PrBa_2Cu_3O_{7-x}$ layers are separated using dashed lines and the pink arrows indicate the interfaces. FIG. 13(b) illustrates a high-magnification scan of the area highlighted by the orange rectangle in FIG. 13(a), demonstrating that the interfaces are fully coherent. FIGS. 13(c)-13(e) illustrate atomically resolved Pr-$M_{5,4}$ edge (red), Y-$L_{3,2}$ edge (green), and Ba-$M_{5,4}$ edge (blue) elemental maps, respectively, evidencing the sharp chemical abruptness of the interfaces. FIG. 13(f) illustrates the RGB overlay and FIG. 13(g) illustrates the simultaneously acquired ADF-STEM image of the same region, outlined by the tan rectangle in FIG. 13(a).

A low-magnification HAADF-STEM image of the 24 nm/8 nm/24 nm $YBa_2Cu_3O_{7-x}/PrBa_2Cu_3O_{7-x}/YBa_2Cu_3O_{7-x}$ trilayer, illustrated in FIG. 13(a), is representative of the complete sample. Individual layers are distinguished as darker and brighter regions due to the atomic number (Z) contrast of HAADF imaging. The $PrBa_2Cu_3O_{7-x}$ layer gives brighter contrast compared to the $YBa_2Cu_3O_{7-x}$ layer because praseodymium ($Z_{Pr}$=59) is heavier than yttrium ($Z_Y$=39). The $LaAlO_3$ substrate also shows relatively bright contrast for the same reason ($Z_{La}$=57). A higher magnification image, illustrated in FIG. 13(b), focusing on a representative interface region reveals that the interfaces in the $YBa_2Cu_3O_{7-x}/PrBa_2Cu_3O_{7-x}/YBa_2Cu_3O_{7-x}$ trilayer are coherent. In neither low-magnification nor in high-magnification scans were c-axis grains observed in these STEM images, consistent with the high volume fraction of a-axis growth measured by XRD. Nevertheless, structural coherence does not prove chemical abruptness at interfaces involving cuprate high-temperature superconductors.

The chemical abruptness of the $YBa_2Cu_3O_{7-x}/$ $PrBa_2Cu_3O_{7-x}/YBa_2Cu_3O_{7-x}$ interfaces were assessed by atomic-resolution elemental mapping via STEM-EELS. FIGS. 13(c)-13(e) illustrate the elemental maps obtained using Pr-$M_{5,4}$ (red), Y-$L_{3,2}$ (green), and Ba-$M_{5,4}$ (blue) edges in the region outlined by the tan rectangle in FIG. 13(a). A red, green, blue (RGB) overlay of the elemental maps from this region is illustrated in FIG. 13(f), while FIG. 13(g) illustrates the simultaneously acquired ADF-STEM image of the same region. Atomic-resolution EELS maps reveal abrupt interface profiles, corroborating the STEM-HAADF images. Both interfaces show minimal Y—Pr intermixing, although some asymmetry of the interface profiles is seen. The lower $YBa_2Cu_3O_{7-x}/PrBa_2Cu_3O_{7-x}$ interface shows a nearly perfect interface profile free of Y—Pr intermixing; the upper interface ($PrBa_2Cu_3O_{7-x}/YBa_2Cu_3O_{7-x}$) presents a slightly rougher local profile with a roughness limited to 1-2 monolayers.

The roughness of the interfaces revealed by STEM and STEM-EELS in FIG. 13 is consistent with the qualitative observations made during growth by in situ RHEED (FIGS. 9(b)-9(g)) of this same $YBa_2Cu_3O_{7-x}/PrBa_2Cu_3O_{7-x}/$ $YBa_2Cu_3O_{7-x}$ trilayer. The arrowed streaks of a-axis oriented $YBa_2Cu_3O_{7-x}$ in FIG. 9(b) promptly disappear in transitioning from the lower $YBa_2Cu_3O_{7-x}$ layer to the $PrBa_2Cu_3O_{7-x}$ barrier layer in FIG. 9(c), indicating that the $PrBa_2Cu_3O_{7-x}$ barrier layer uniformly covers the lower $YBa_2Cu_3O_{7-x}$ layer. At the upper interface, however, it takes noticeably longer for the arrowed streaks of the upper $YBa_2Cu_3O_{7-x}$ layer to reappear (FIGS. 9(f) and 9(g)). Further, the time that it takes for the arrowed streaks of a-axis oriented $YBa_2Cu_3O_{7-x}$ to reappear in going from the $PrBa_2Cu_3O_{7-x}$ barrier to the $YBa_2Cu_3O_{7-x}$ upper layer takes progressively longer for the thicker trilayers. This is consistent with the increased surface roughness seen by AFM in FIG. 11 as the thickness of the $YBa_2Cu_3O_{7-x}$ layers increases.

In addition to the coherent and chemically sharp interfaces, some defects were observed by STEM. For example, intergrowths of an extra Cu—O layer intercalated into the $YBa_2Cu_3O_{7-x}$ structure to locally form $YBa_2Cu_4O_{8-x}$ (FIG. 20) are seen. Such intergrown layers are well-known and common in $YBa_2Cu_3O_{7-x}$—in bulk, thin-films, and heterostructures.

The cross-sectional HAADF-STEM imaging also unveiled the location of the cubic perovskite(Y,Ba)$CuO_{3-x}$ phase detected in the XRD measurements. The thickness of the cubic (Y,Ba)$CuO_{3-x}$ layer is found to be ~10 nm and it is located under the bottom $YBa_2Cu_3O_{7-x}$ layer (FIG. 20($a$)). This cubic $(Y,Ba)CuO_{3-x}$ layer forms at the start of growth when the substrate is coldest and surface diffusion is most constrained. Yttrium and barium are unable to diffuse sufficiently far to establish the Y—Ba—Ba— . . . ordered arrangement found in the unit cell of $YBa_2Cu_3O_{7-x}$; instead yttrium and barium share the A-site of the resulting perovskite structure, with copper on the B-site.[47]

As the temperature of the substrate is ramped, the diffusion lengths increase, and in-plane structural order emerges. The resulting a-axis $YBa_2Cu_3O_{7-x}$ grains grow epitaxially in one of two symmetry equivalent orientations: with the c-axis parallel to either [010] or [001] of the cubic $(Y,Ba)CuO_{3-x}$ layer on which they nucleate on the (100) $LaAlO_3$ substrate. One set of such domains is clearly seen in FIG. 20: the set with the c-axis along the horizontal direction of the image. The other set, with the c-axis oriented into the plane of the image, are more difficult to establish because their spacing along the horizontal direction is the same perovskite spacing as the cubic $(Y,Ba)CuO_{3-x}$ layer on which they nucleated.

The ~10 nm thick cubic $(Y,Ba)CuO_{3-x}$ layer is believed to only lie under the a-axis oriented $YBa_2Cu_3O_{7-x}$ layer and the regions in which this perovskite structure appears to extend further, i.e., through and all the way to the surface of the trilayer, are actually the set of a-axis domains oriented with the c-axis running into the plane of the image. This is consistent with the grain size of the a-domains seen in the AFM images in FIGS. 11($a$)-11($d$) as well as published by others for a-axis $YBa_2Cu_3O_{7-x}$ grown on (100) $LaAlO_3$. From the XRD-scans (FIG. 10($b$) and FIG. 18), there is an equal volume fraction of both 90° in-plane rotation twin variants, and although the volume sampled in this STEM investigation is small, this is also consistent with STEM observations. Once the substrate temperature is sufficiently high that the a-axis $YBa_2Cu_3O_{7-x}$ grains nucleate, both twin variants continue through the entire $YBa_2Cu_3O_{7-x}$/$PrBa_2Cu_3O_{7-x}$/$YBa_2Cu_3O_{7-x}$ trilayer.

Lastly, additional cross-sectional STEM investigations were performed on a less-ideal 32 nm/8 nm/32 nm sample in order to gain insights on the effect of c-axis grains in the trilayers. XRD shows the sample chosen to contain a higher volume fraction (16%) of c-axis oriented $YBa_2Cu_3O_{7-x}$/$PrBa_2Cu_3O_{7-x}$ (FIG. 21) and to have a higher rms roughness than the 32 nm/8 nm/32 nm trilayer characterized in FIGS. 10-12. HAADF-STEM imaging (FIG. 22) of this less-ideal 32 nm/8 nm/32 nm trilayer confirms the presence of c-axis oriented grains in the structure and also demonstrates the rougher interfaces. Although the interfaces are rougher, STEM-EELS (FIG. 23) shows that they remain chemically abrupt. These results, when evaluated together, explain the rougher surfaces of the thicker samples. The c-axis grain formation in the bottom $YBa_2Cu_3O_{7-x}$ layer not only disturbs the $PrBa_2Cu_3O_{7-x}$ layer (and interface) profiles, but also directly influences the top surface roughness with changes in the local structural homogeneity in the first layers of the growth. The strong correlation between surface roughness and the volume fraction of c-axis grains in a-axis $YBa_2Cu_3O_{7-x}$ films has been previously noted. To avoid c-axis oriented $YBa_2Cu_3O_{7-x}$, growth is initiated at a substrate temperature where only cubic $(Y,Ba)CuO_{3-x}$ can nucleate.

In summary, a-axis $YBa_2Cu_3O_{7-x}$/$PrBa_2Cu_3O_{7-x}$/$YBa_2Cu_3O_{7-x}$ trilayers were grown with improved structural quality. By leveraging a temperature-ramping procedure that begins with a cubic $(Y,Ba)CuO_{3-x}$ buffer layer, high-quality a-axis trilayers were grown as confirmed by ex-situ XRD measurements. AFM investigations revealed the improved surface quality with rms roughness that is less than $\xi_a$ for the thinnest $YBa_2Cu_3O_{7-x}$/$PrBa_2Cu_3O_{7-x}$/$YBa_2Cu_3O_{7-x}$ trilayers. STEM analyses unveiled the interrelation between c-axis oriented regions and surface roughness. Resistivity vs. temperature (R-T) measurements exhibited an onset of the superconducting transition at $T_{onset}$~85 K and also the widening of the superconducting transition width with decreasing $YBa_2Cu_3O_{7-x}$ film thickness. Sharp and coherent interfaces with limited elemental intermixing are evidenced by atomic-resolution HAADF-STEM and STEM-EELS. These findings demonstrate that precise control of the growth conditions results in sharp interfaces and smooth surfaces required in a-axis-based $YBa_2Cu_3O_{7-x}$ heterostructures, e.g., Josephson Junctions and other oxide electronics.

Example 3

In some implementations of the invention, various fabrication techniques are utilized to enhance operation and testing of the various Josephson Junctions described above. In some implementations of the invention, an ion mill etching depth is decreased to intentionally leave some PBCO insulator on top of the bottom YBCO layer. In some implementations of the invention, an ion mill etching angle is decreased to decrease a depth of any damage to the bottom YBCO layer introduced by the ion mill. In some implementations of the invention, an additional, larger Josephson Junction is connected in series with the Josephson Junction under test to act as a short to the bottom YBCO layer in implementations where PBCO covers the bottom YBCO; the larger Josephson Junction thus provides an indirect connection to the bottom YBCO layer. In some implementations, two or more of the fabrication techniques mentioned above are used in combination with one another as would be appreciated.

For example, in a trilayer comprised of 640 angstroms (Å) of YBCO (i.e., the top YBCO layer), 80 Å of PBCO, and 640 Å of YBCO (i.e., the bottom YBCO layer) on a LAO substrate, an ion mill etch rate was determined to be roughly 2 Å/s with an ion mill etch angle set at 90° (i.e., straight-on impact). In some implementations, in a first etching step of the trilayer, the ion mill etch angle may be set at 90° to remove the top YBCO layer; this etch angle provides the best aspect ratio, thereby most accurately transferring a photolithography pattern at the expense of some ion damage to the underlying material. In some implementations, in a second etching step of the trilayer, the PBCO layer is etched at an "off angle" (i.e., an angle less than 90°) in an effort to ensure complete removal of the top YBCO layer without introducing additional ion damage to the bottom YBCO layer. In some implementations, the off angle ranges between 30° and 70°. In some implementations, the off angle ranges between 40° and 60°. The etching parameters are provided in Table 3 in accordance with various implementations of the invention. These particular etching parameters may be specific to an ion mill being used, and may not be universally applicable to other ion mills or other etching tools as would be appreciated.

TABLE 3

| Etching Parameters | | | | |
| --- | --- | --- | --- | --- |
| Step | Impact Angle | Etch Rate Å/s | Time (s) | Etch depth (Å) |
| 1 | 90° | 2 | 312 | 640 |
| 2 | 50° | 2 | 30 | 60 |

Figure 24:
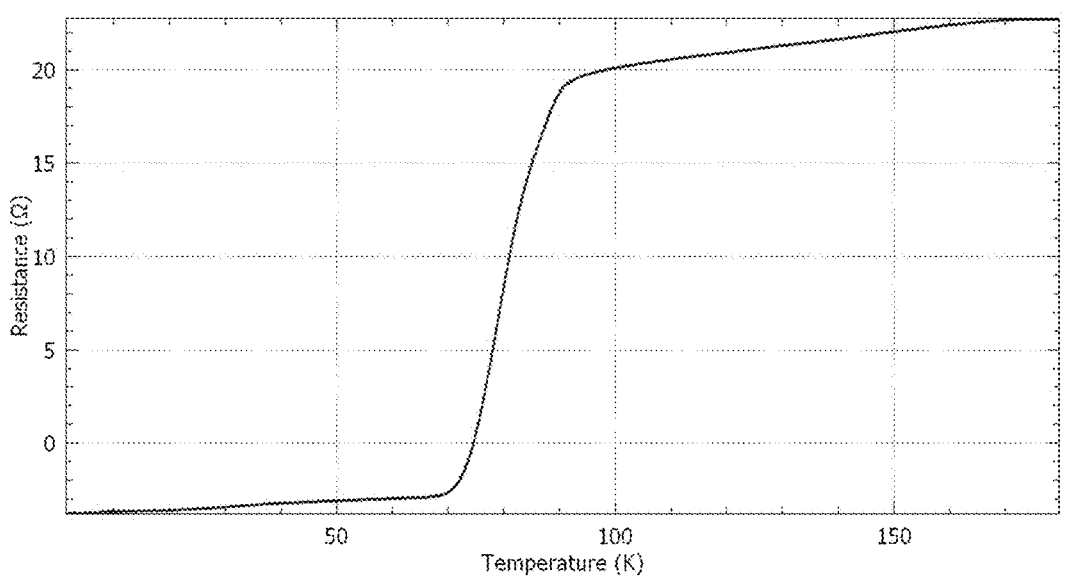
FIG. 24 illustrates an R-T curve for a top layer of YBCO (in a YBCO/PBCO/TBCO trilayer) confirming presence of a critical temperature, $T_c$, and hence, transition of this layer of YBCO to a superconducting state, according to various implementations of the invention.

In this example, a measurement of $T_c$ on the bottom YBCO layer covered with PBCO indicated an open circuit, thereby verifying an intact insulating PBCO layer over the bottom YBCO layer. In addition, AFM was used to accurately measure a total amount of material removed for step 1 and 2 combined as approximately 700 Å; though some ion damage beyond the PBCO layer into the bottom YBCO layer may still be possible. FIG. 24 illustrates an R-T curve for the top YBCO layer (in a YBCO/PBCO/YBCO trilayer) confirming presence of a critical temperature, $T_c$, and hence, transition of this top YBCO layer to a superconducting state. This R-T curve confirms that the etching parameters did not negatively impact this top layer.

However, leaving the bottom YBCO layer covered with PBCO makes a direct electrical contact with the bottom YBCO layer extremely difficult, if not impossible (which is why $T_c$ on the bottom layer measured as an open circuit). To combat this, in some implementations of the invention, the bottom YBCO layer was indirectly contacted via a relatively large secondary Josephson Junction (e.g., 400 μm×400 μm). FIG. 27(*b*) illustrates the larger secondary Josephson Junction (illustrated as JJ-2) indirectly contacted to the bottom YBCO layer of the smaller Josephson Junction under test (illustrated as JJ-1). As illustrated, each Josephson Junction under test is coupled in series to the larger Josephson Junction. (For the sake of completeness, prior testing relied on an initial testing configuration illustrated in FIG. 27(*a*) which required direct electrical contact with the bottom YBCO layer, which contact is no longer possible in implementations with a covering layer of PBCO.)

Figure 25:
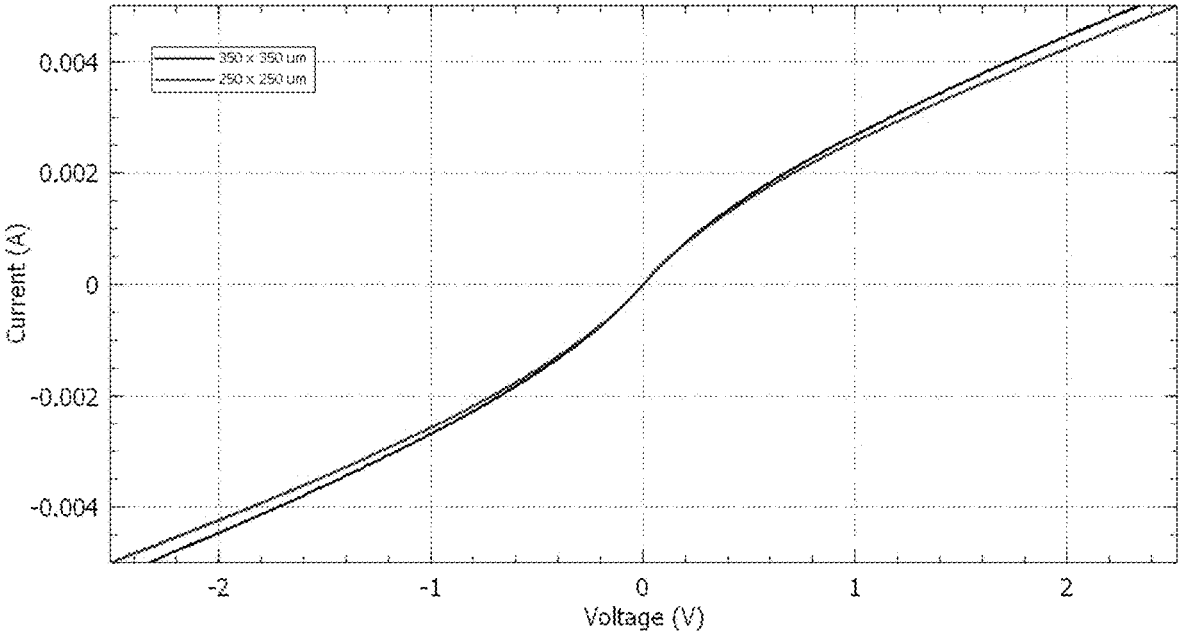
FIG. 25 illustrates an I-V curve confirming operation for each of two Josephson Junctions under test, according to various implementations of the invention.

As would be appreciated, a larger Josephson Junction will have a much larger $I_c$ in comparison to the smaller Josephson Junction, and therefore (ideally) stay in its superconducting state even as the smaller Josephson Junction transitions to its resistive state. (See, e.g., FIG. 26.) In essence, the larger Josephson Junction acts as a superconducting wire connecting to the bottom YBCO layer through the PBCO, allowing measurements of various characteristics of the smaller Josephson Junction under test. In some implementations of the invention, to ensure that the larger Josephson Junction acts as a superconducting wire, a scaling factor may be greater than 3 (i.e., the larger Josephson Junction may be 3 times larger in area, or more, than the smaller Josephson Junction under test). As would be appreciated, this scaling factor may improve the I-V curves of the Josephson Junction under test. In the examples of FIG. 25, the scaling factors were both less than 3. However, the scaling factor may be increased as the size of the smaller Josephson Junction under test are decreased.

FIG. 25 illustrates an I-V curve confirming operation for each of two Josephson Junctions (one 350 μm×350 μm and one 250 μm×250 μm), according to various implementations of the invention. In some implementations of the invention, a size of each of these Josephson Junction may be reduced to roughly 5 μm×5 μm or smaller.

The I-V curves of FIG. 25 illustrate soft transitions from superconducting state to resistive state with a critical current, $I_c$, of ~1 mA, which current is typical of conventional Josephson Junctions. These I-V curves confirm successful contact with both top and bottom YBCO layers in the trilayer, which remained intact during and after fabrication. FIG. 26 illustrates an ideal I-V curve for operation of a Josephson Junction, with a strong transition between a superconducting and resistive states as would be appreciated. While the critical currents of the I-V curves of FIG. 25 are not as sharply defined as the ideal I-V curve in FIG. 26, subsequent fabrication improvements are expected to improve these I-V curves. Such fabrication process improvements may include, but are not limited to, reducing the size of the Josephson Junction under test, increasing the scaling factor, and other fabrication improvements.

In some implementations of the invention, ion mill damage may be used advantageously to pattern damaged regions as electrical insulation, which is a common fabrication step for semiconductor and superconductor circuits used to isolate one part of the circuit from another as would be appreciated.

Figure 28:
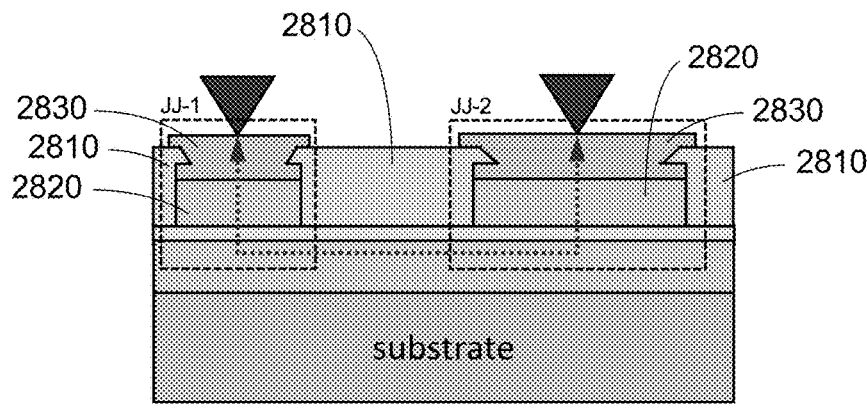
FIG. 28 illustrates silicon dioxide (SiO₂) added as an insulating layer between islands of YBCO in a top YBCO layer of a Josephson Junction in accordance with various implementations of the invention.
Figure 29:
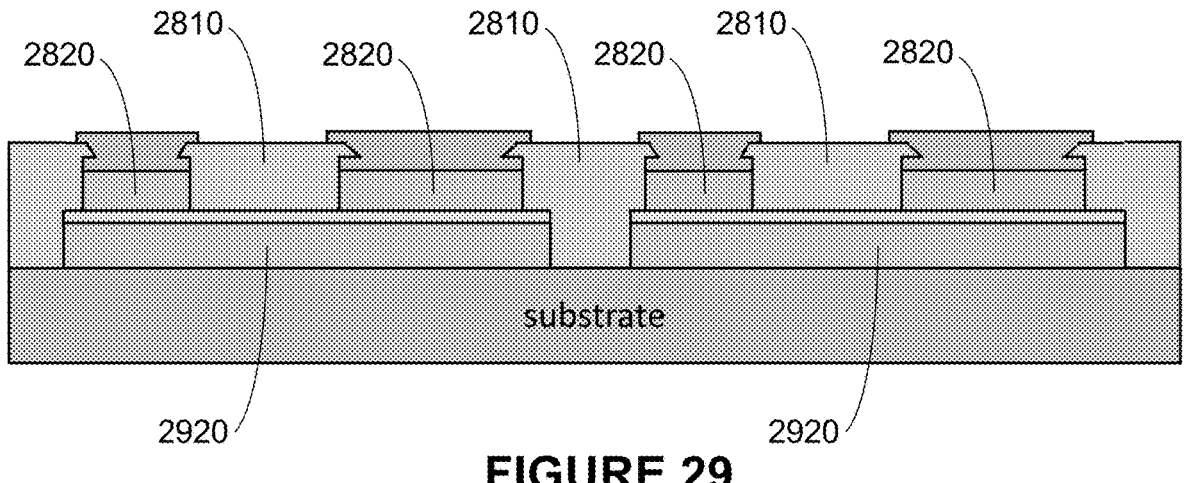
FIG. 29 illustrates SiO₂ added as an insulating layer between islands of YBCO in a top YBCO layer of a Josephson Junction and between islands of YBCO in a bottom YBCO layer of a Josephson Junction in accordance with various implementations of the invention.

In some implementations of the invention, a silicon dioxide ($SiO_2$) insulating layer added between islands in a top YBCO layer of a Josephson Junction isolates a contact layer (described below) from YBCO (or other conductive components) in the Josephson Junction. In some implementations of the invention, the $SiO_2$ insulating layer added between islands in a bottom YBCO layer of adjacent Josephson Junctions isolates the contact layer (or other conductive components) from YBCO (or other conductive components) in the Josephson Junction. In some implementations of the invention, the $SiO_2$ insulating layer provides a barrier between top and bottom YBCO contact layers. FIG. 28 illustrates $SiO_2$ added as a layer 2810 between islands 2820 of YBCO in the top YBCO layer of a Josephson Junction. FIG. 29 illustrates $SiO_2$ added as a layer 2810 between islands 2820 of YBCO in the top YBCO layer of a Josephson Junction and between islands 2920 of YBCO in the bottom YBCO layer of a pair of Josephson Junctions.

In some implementations of the invention, the $SiO_2$ is deposited in the gaps formed between the islands 2820 of YBCO in the top YBCO layer and/or the islands 2920 of YBCO in the bottom YBCO layer. In some implementations of the invention, the $SiO_2$ above islands 2820 of YBCO is etched or otherwise removed to expose a top surface of islands 2820 of YBCO, thereby creating a via through the $SiO_2$ to the top YBCO layer of the Josephson Junction. In some implementations of the invention, this via may be created using patterned lift off of the $SiO_2$ as would be appreciated. In some implementations of the invention, this via may be created using dry etching using an ion mill as would be appreciated. In some implementations of the invention, this via may be created using wet etching using, for example, a solution of hydrofluoric acid as would be appreciated. In some implementations of the invention, this via maybe created using reactive ion etching (RIE) of the $SiO_2$ as would be appreciated. Other techniques for creating a via through the SiO2 may be used as would be appreciated.

In some implementations of the invention, this via may be created using an etch stop layer of gold (Au) over islands 2820 of YBCO. In some implementations of the invention, this etch stop layer of gold protects the top YBCO layer from etching during formation of the via through the $SiO_2$. In some implementations of the invention, this etch stop layer of gold enhances quality of contact with the top YBCO later.

In some implementations of the invention, the top and bottom layers of YBCO in the a-axis trilayer are approximately 100 nm thick with an approximately 12 nm thick layer of insulator sandwiched in between. In some implementations of the invention, the top and bottom layers of YBCO in the a-axis trilayer are approximately 64 nm thick with an approximately 8 nm thick layer of insulator sandwiched in between. In some implementations of the invention, the insulator is PBCO. In some implementations of the invention, other thicknesses of YBCO and/or insulator layer may be used as would be appreciated.

In some implementations of the invention, the $SiO_2$ insulating layer and/or contact layers are formed using electron beam deposition as would be appreciated. In some implementations of the invention, the $SiO_2$ insulating layer and/or contact layers are formed using sputtering techniques as would be appreciated. Other techniques for depositing the $SiO_2$ insulating layer and/or contact layers may be used as would be appreciated.

Figure 30A:
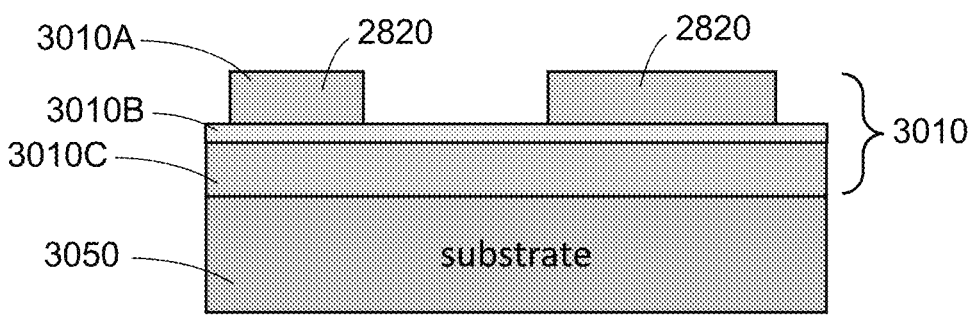
FIGS. 30(*a*)-30(*d*) illustrate various stages of fabricating Josephson Junctions with improved contacts in accordance with various implementations of the invention.

FIGS. 30(a)-30(d) illustrate various stages of fabrication of the a-axis trilayer Josephson Junctions in accordance with various implementations of the invention. FIG. 30(a) illustrates an a-axis trilayer 3010 formed in accordance with various implementations of the invention. Trilayer 3010 includes a top YBCO layer 3010A, an insulating layer 3010B, and a bottom YBCO layer 3010C. In some implementations of the invention, insulating layer 3010B is a PBCO layer 3010B. In some implementations, each of top YBCO layer 3010A and bottom YBCO layer 3010C are approximately 100 nm thick. In some implementations, insulating layer 3010B is approximately 12 nm thick. In some implementations, trilayer 3010 is formed on a substrate 3050 as described above. As illustrated, islands 2810 of YBCO (two illustrated in FIG. 30(a)) are formed in top YBCO layer 3010A as described above. Each island 2810 of YBCO is associated with a unique Josephson Junction as would be appreciated.

Figure 30B:
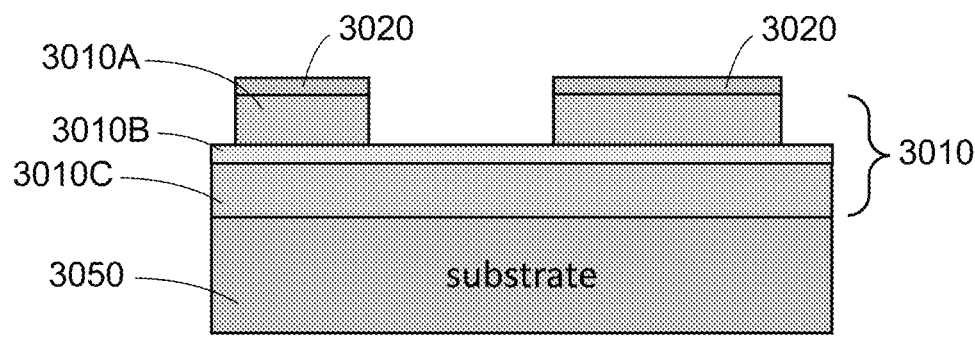
Figure 30C:
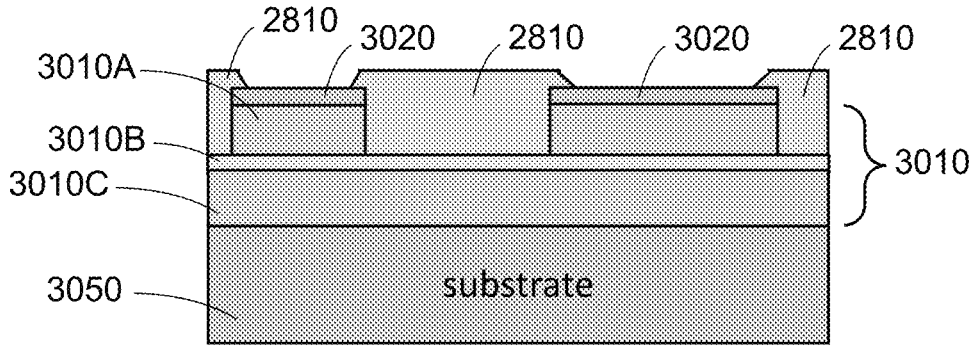
Figure 30D:
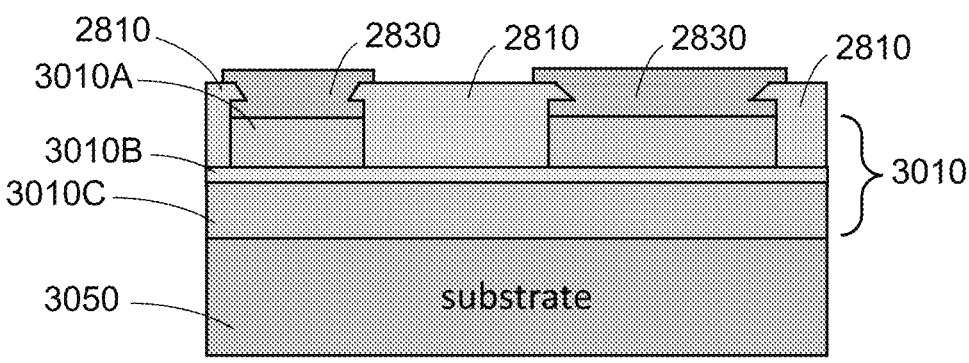

FIG. 30(b) illustrates a stop etch layer 3020 deposited onto a top surface of each island of YBCO 2810. FIG. 30(c) illustrates barriers 2810 after: 1) $SiO_2$ is deposited between islands 2810 and over stop etch layer 3020; and 2) vias through the $SiO_2$ to stop etch layer 3020 are formed over islands 2810. FIG. 30(d) illustrates contact layer 2830 formed by depositing gold over the exposed stop etch layer 3020.

In some implementations, contact layer 2830 comprises a first layer of titanium which is deposited over the exposed stop etch layer 3020 and a second layer of gold which is deposited over the first layer of titanium.

Example 4

In some implementations of the invention, various fabrication techniques are utilized to enhance operation and testing of the various Josephson Junctions described above. In particular, this example includes Josephson Junctions formed in an a-axis trilayer of YBCO/PBCO/YBCO (100 nm, 12m, 100 nm think, respectively), using a $SiO_2$ barrier between islands of YBCO in the top YBCO layer and a gold stop etch layer as described above in accordance with various implementations of the invention.

FIG. 32(a) illustrates a superconducting transition in the top YBCO layer of a Josephson Junction fabricated in accordance with various implementations of the invention. As illustrated, a superconducting transition starts at 75K, but due to the broadening of the transition, zero resistance temperature is reached around 50K. This broadening in the transition temperature is attributed to additional heating and cleaning steps utilized during fabrication of this particular Josephson Junction. The slight rise in resistance at a lower temperature can be attributed to the increased contact resistance at lower temperatures.

FIG. 32(b) illustrates an I-V curve characterizing a Josephson Junction fabricated in accordance with various implementations of the invention. The I-V curve indicates a critical current for which zero voltage is measured across the Josephson Junction. The critical current calculated from the intercept of linear fitting of the resistive region of the I-V curve at 2K is $4.7\times10^{-5}$ A, with a critical current density of 1175 A/cm$^2$ The critical current density measurement corresponds to a 7.8 times improvement in the critical current density (even with a larger barrier thickness) over prior samples. An $I_cR_N$ factor for this particular Josephson Junction was determined as $1.36\times10^6$ µV, ten times greater than prior samples. Values of $I_cR_N$ factors define junction frequency and drive various JJ-based applications (RSFQ, JPU clock cycles, etc.). Higher $I_cR_N$ factors relates to higher frequency Josephson Junctions as $f_c=(2e/n)^*I_cR_N$. The $I_cR_N$ factor controls the noise level in a SQUID, ultimately determining the sensitivity of SQUID-based sensors. A higher $I_cR_N$ factor is indicative of lower background noise and higher sensitivity. Table 4 compares measurement results with results published in Ken'ichi Kuroda, et al., "Fabrication of full high-tc superconducting yba2cu3o7-x trilayer junctions using a polishing technique," *Japanese Journal of Applied Physics*, 42(8B):L1006, August 2003.

TABLE 4

| Summary of Example 4 Josephson Junction | | | | | | |
|---|---|---|---|---|---|---|
| Sample | Critical Current Density (A/cm$^2$) | $I_cR_N$ (µV) | JJ Area (µV$^2$) | Barrier | Thickness (nm) | YBCO Type |
| Example 4 | 1175 | $1.35 \times 10^6$ | $2 \times 2$ | PBCO | 12 | a-axis |
| Published | 110 | 160 | $5 \times 5$ | PBCO | 10 | c-axis |

Figure 33:
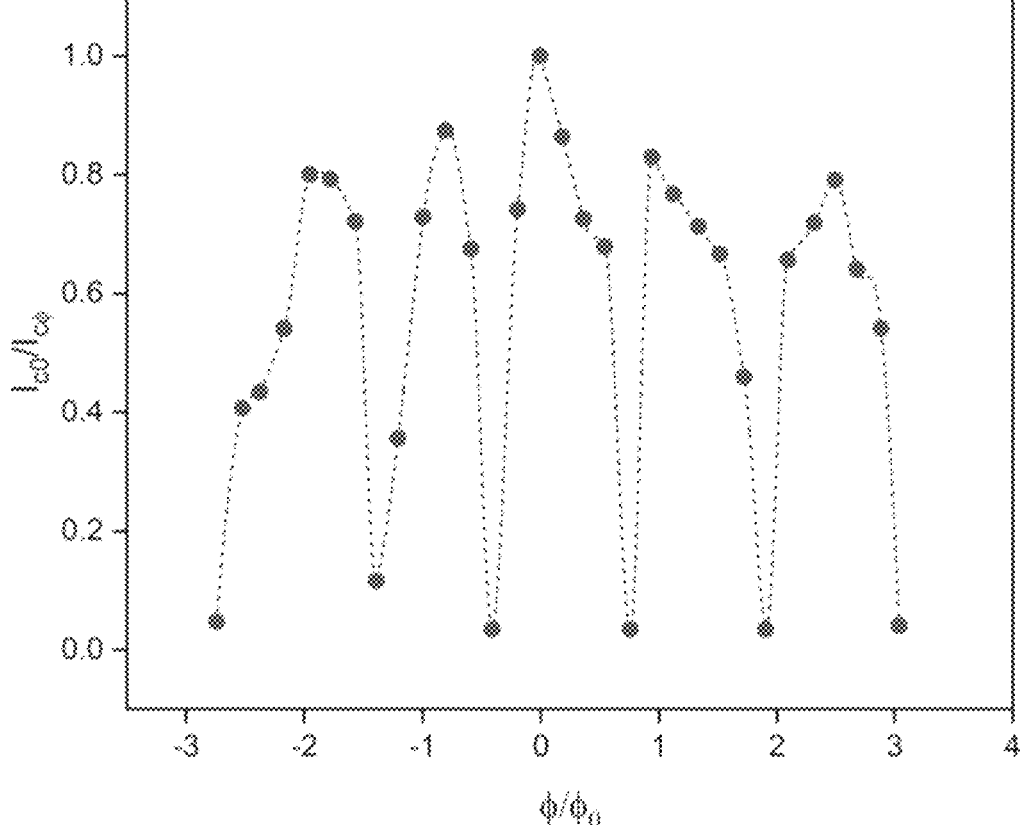
FIG. 33 illustrates a Fraunhofer pattern characterizing a Josephson Junction fabricated in accordance with various implementations of the invention.

An external magnetic field was applied observe the quantum interference pattern created by critical current modulations, the Fraunhofer pattern. FIG. 33 illustrates a Fraunhofer pattern characterizing a Josephson Junction fabricated in accordance with various implementations of the invention. While an ideal Fraunhofer pattern has a larger central lobe corresponding to zero magnetic field and smaller lobes for non-zero magnetic field values, Ambature's model displayed sidelobes as large as the central lobe, possibly due to the nonuniform critical current density of the junction.

In some implementations, such as illustrated in FIG. 28, a SQUID is formed using a pair of Josephson Junctions (i.e., JJ-1 and JJ-2). In some implementations, focused ion beam (FIB) milling was used to sculpt SQUIDs with a loop area of $1\times3$ µm$^2$. FIG. 31(a) includes an SEM image of a Josephon Junction with an area of 4 µm$^2$, a collector, and 4-probe contacts. FIG. 31(b) includes an SEM image of a SQUID loop formed from a-axis tri-layer Josephson Junctions in accordance with various implementations of the invention. While these SQUIDs were too small to have an exceptional signal-to-noise ratio, a standard modulation curve using a physical property measurement system (PPMS) was nonetheless measured. In some implementations, pickup and feedback coils may be added to improve noise and develop a magnetometer.

While the invention has been described herein in terms of various implementations, it is not so limited and is limited only by the scope of the following claims, as would be apparent to one skilled in the art. These and other implementations of the invention will become apparent upon consideration of the description provided above and the accompanying figures. In addition, various components and features described with respect to one implementation of the invention may be used in other implementations as would be appreciated.

What is claimed:

1. A method for fabricating a Josephson Junction, the method comprising:

depositing an etch stop layer of gold on top of at least two spatially separated islands of YBCO, wherein the YBCO forms a top layer of an a-axis trilayer of YBCO/insulator/YBCO;

depositing a layer of silicon dioxide between the at least two spatially separated islands of YBCO and over the etch stop layer;

etching the silicon dioxide to expose the etch stop layer without exposing any other surfaces of the trilayer; and depositing a contact layer directly onto the exposed etch stop layer, wherein the contact layer comprises a layer of gold.

2. The method of claim 1, wherein the contact layer comprises a layer of titanium.

3. The method of claim 1, wherein the contact layer comprises a layer of titanium under the layer of gold.

4. The method of claim 1, wherein the insulator in the a-axis trilayer of YBCO/insulator/YBCO comprises PBCO.

5. The method of claim 1, further comprising applying a wire bond to the electrical contact on each of the separated islands.

6. The method of claim 1, wherein etching the silicon dioxide to expose the etch stop layer comprises forming a via in the silicon dioxide through to the etch stop layer.

7. A method for fabricating a Josephson Junction, the method comprising:

etching islands in a top YBCO layer of an a-axis trilayer of YBCO/PBCO/YBCO;

depositing an etch stop layer of gold on top of the islands in the top YBCO layer;

depositing a layer of silicon dioxide between the islands in the top YBCO layer and over the etch stop layer;

etching the silicon dioxide to expose the etch stop layer without exposing any other surfaces of the trilayer; and depositing a contact layer directly onto the exposed etch stop layer, wherein the contact layer comprises a layer of gold.

8. The method of claim 7, further comprising etching islands in a bottom YBCO layer of the a-axis trilayer of YBCO/PBCO/YBCO.

9. The method of claim 7, wherein the contact layer comprises a layer of titanium.

10. The method of claim 7, wherein the contact layer comprises a layer of titanium under the layer of gold.

11. The method of claim 7, further comprising applying a wire bond to the electrical contact on each of the separated islands.

12. The method of claim 7, wherein etching the silicon dioxide to expose the etch stop layer comprises forming a via in the silicon dioxide through to the etch stop layer.

13. The method of claim 12, further comprising depositing a contact layer in the via.

* * * * *